(12) United States Patent
Park

(10) Patent No.: US 11,922,718 B2
(45) Date of Patent: Mar. 5, 2024

(54) FINGERPRINT SENSOR PACKAGE AND SENSOR PACKAGE

(71) Applicant: Samsung Electronics Co., Ltd., Suwon-si (KR)

(72) Inventor: Younghwan Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/750,924

(22) Filed: May 23, 2022

(65) Prior Publication Data

US 2023/0119690 A1  Apr. 20, 2023

(30) Foreign Application Priority Data

Oct. 20, 2021  (KR) ........................ 10-2021-0140518

(51) Int. Cl.
  *G06V 40/13*   (2022.01)
  *G06F 3/044*   (2006.01)
  *H01L 23/00*   (2006.01)

(52) U.S. Cl.
  CPC ........ *G06V 40/1329* (2022.01); *G06F 3/0446* (2019.05); *H01L 24/17* (2013.01); *H01L 24/27* (2013.01); *H01L 24/33* (2013.01); *G06F 2203/04103* (2013.01)

(58) Field of Classification Search
  None
  See application file for complete search history.

(56) References Cited

U.S. PATENT DOCUMENTS

| 7,192,798 | B2 | 3/2007 | Okada et al. |
| 7,705,613 | B2 | 4/2010 | Misra et al. |
| 10,268,872 | B2 | 4/2019 | Huang et al. |
| 10,297,515 | B2 | 5/2019 | Park et al. |
| 2017/0249493 | A1* | 8/2017 | Yu .......................... H01L 25/16 |
| 2023/0072033 | A1* | 3/2023 | Hsu ........................ G06V 40/13 |

FOREIGN PATENT DOCUMENTS

| JP | 2004-319678 A | 11/2004 |
| JP | 2008-113894 A | 5/2008 |
| KR | 102195672 B1 | 12/2020 |

* cited by examiner

*Primary Examiner* — Joseph R Haley
(74) *Attorney, Agent, or Firm* — Harness, Dickey & Pierce, P.L.C.

(57) ABSTRACT

A fingerprint sensor package may include a film substrate, an interconnection substrate on the film substrate, a semiconductor chip on the interconnection substrate, a conductive structure on the interconnection substrate and laterally isolated from direct contact with the semiconductor chip, and an interposer substrate on the semiconductor chip and the conductive structure. The conductive structure may include first and second conductive structures, which are electrically separated from each other. The interposer substrate may include a first sensing pattern electrically connected to the first conductive structure and a second sensing pattern on a top surface of the first sensing pattern and electrically connected to the second conductive structure. The second sensing pattern may be vertically isolated from direct contact with from the first sensing pattern. The second sensing pattern may have a longitudinal axis parallel to a direction crossing a longitudinal axis of the first sensing pattern, in a plan view.

20 Claims, 18 Drawing Sheets

FINGERPRINT SENSOR PACKAGE AND SENSOR PACKAGE

CROSS-REFERENCE TO RELATED APPLICATION

This U.S. non-provisional patent application claims priority under 35 U.S.C. § 119 to Korean Patent Application No. 10-2021-0140518, filed on Oct. 20, 2021, in the Korean Intellectual Property Office, the entire contents of which are hereby incorporated by reference.

BACKGROUND

The present inventive concepts relate to sensor packages, and in particular, to fingerprint sensor packages.

A fingerprint recognition sensor is configured to recognize a fingerprint of a user and is widely used as a part of conventional door-lock systems and in recent mobile products (e.g., laptop computers and mobile phones). The fingerprint recognition sensor may be classified into ultrasonic wave, infrared light, and electrostatic capacitance types, depending on its operation principle. Many studies are being conducted to improve reliability and sensitivity of the fingerprint recognition sensor.

SUMMARY

Some example embodiments of the inventive concepts provides a fingerprint sensor package, which is configured to improve the reliability and sensitivity in a sensing process, and a fingerprint sensing device including the same.

According to some example embodiments of the inventive concepts, a fingerprint sensor package may include a film substrate, an interconnection substrate on the film substrate, a semiconductor chip on the interconnection substrate, a conductive structure on the interconnection substrate, the conductive structure laterally isolated from direct contact with the semiconductor chip, and an interposer substrate on both the semiconductor chip and the conductive structure. The conductive structure may include a first conductive structure and a second conductive structure, the first conductive structure and the second conductive structure electrically separated from each other. The interposer substrate may include a first sensing pattern electrically connected to the first conductive structure and a second sensing pattern on a top surface of the first sensing pattern, the second sensing pattern electrically connected to the second conductive structure. The second sensing pattern may be vertically isolated from direct contact with the first sensing pattern, and a longitudinal axis of the second sensing pattern may be parallel to a direction crossing a longitudinal axis of the first sensing pattern, when viewed in a plan view.

According to some example embodiments of the inventive concepts, a sensor package may include a film substrate having a first region and a second region, and a plurality of fingerprint sensors isolated from direct contact with each other on the film substrate. Each fingerprint sensor of the plurality of fingerprint sensors may include an interconnection substrate on the first region of the film substrate, a semiconductor chip on the interconnection substrate, conductive structures on the interconnection substrate and laterally isolated from direct contact with the semiconductor chip, and an interposer substrate on both the semiconductor chip and the conductive structures. The conductive structures may include a first conductive structure and a second conductive structure, the first conductive structure and the second conductive structure electrically separated from each other. The interposer substrate may include a first sensing pattern electrically connected to the first conductive structure and a second sensing pattern vertically isolated from direct contact with a top surface of the first sensing pattern. The second sensing pattern may be electrically connected to the second conductive structure.

According to some example embodiments of the inventive concepts, a fingerprint sensor package may include a film substrate including a coupling terminal, an interconnection substrate on the film substrate, a connection solder between the film substrate and the interconnection substrate and electrically connected to the coupling terminal, a lower under-fill layer between the film substrate and the interconnection substrate and covering a side surface of the connection solder, a semiconductor chip on a top surface of the interconnection substrate, bumps between the top surface of the interconnection substrate and the semiconductor chip, a passive device on the top surface of the interconnection substrate and laterally isolated from direct contact with the semiconductor chip, conductive structures on the top surface of the interconnection substrate and laterally isolated from direct contact with both the semiconductor chip and the passive device, an interposer substrate on both the semiconductor chip and the conductive structures and electrically connected to the conductive structures, and a mold layer between the interconnection substrate and the interposer substrate and covering side surfaces of the conductive structures, the semiconductor chip, and the passive device. The interposer substrate may include first sensing patterns, second sensing patterns on top surfaces of the first sensing patterns and vertically isolated from direct contact with the top surfaces of the first sensing patterns, and a protection layer covering the second sensing patterns.

DETAILED DESCRIPTION

Figure 1:
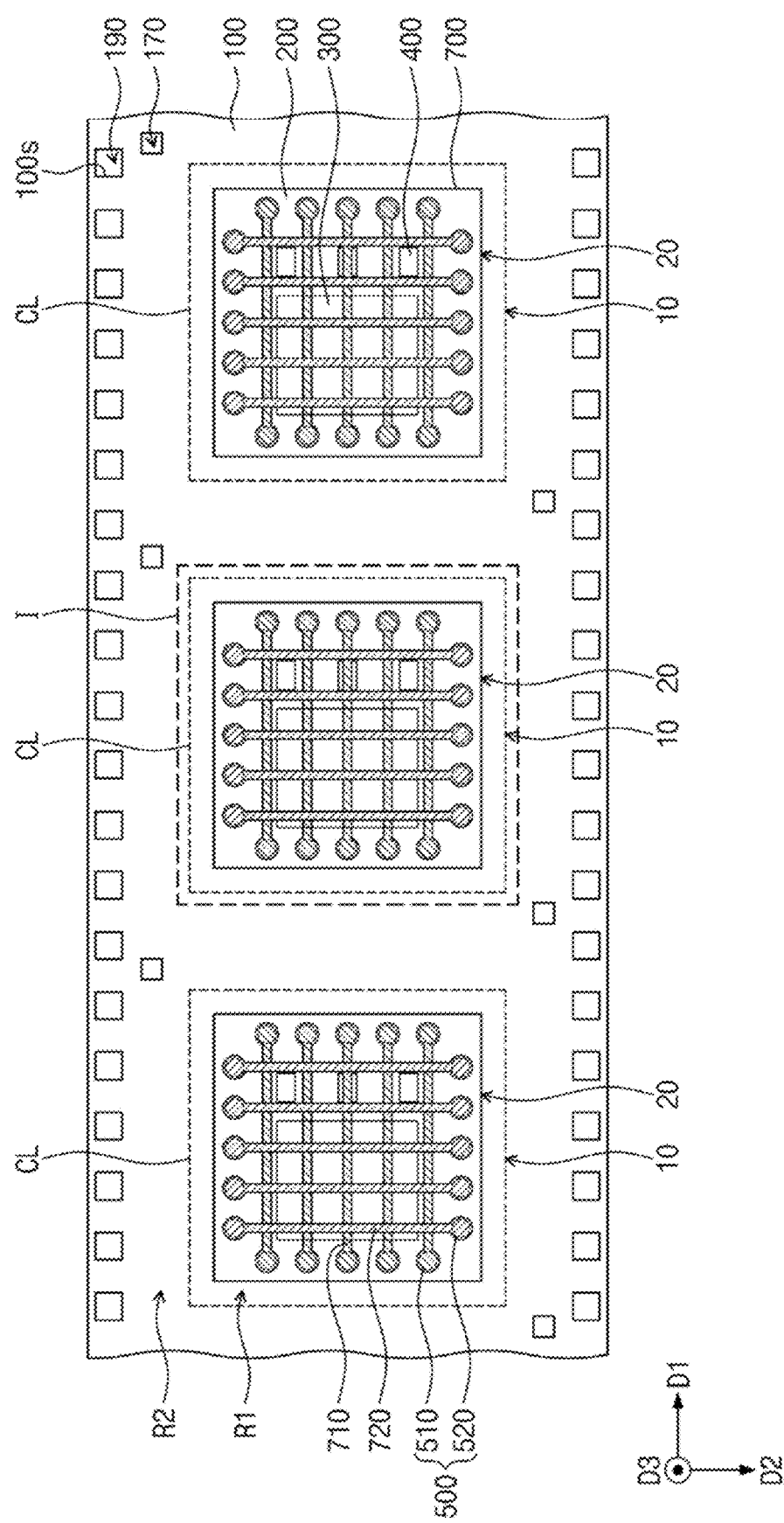
FIG. 1 is a plan view illustrating a layout of a sensor package according to some example embodiments of the inventive concepts.

Hereinafter, some example embodiments of the present inventive concepts will be described in detail so that a person skilled in the art would understand the same. The inventive concepts may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of 10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of 10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of 10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, elements that are described to be in contact with other elements may be understood to be in "direct" contact with the other elements.

As described herein, an element that is described to be "spaced apart" from another element, in general and/or in a particular direction (e.g., vertically spaced apart, laterally spaced apart, etc.) may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) may be understood to be isolated from direct contact with each other, in general and/or in the particular direction (e.g., isolated from direct contact with each other in a vertical direction, isolated from direct contact with each other in a lateral or horizontal direction, etc.).

In the present specification, like reference numerals denote like elements, and thus their description will be omitted. A sensor package, a fingerprint sensor package, and a fingerprint sensing device according to some example embodiments will now be described more fully with reference to the accompanying drawings, in which example embodiments are shown.

FIG. 1 is a plan view illustrating a layout of a sensor package according to some example embodiments of the inventive concepts.

Referring to FIG. 1, a sensor package may include a film substrate 100 and a plurality of fingerprint sensors 20. The film substrate 100 may be flexible.

The film substrate 100 may include one or more first regions R1, a second region R2, and cut-lines CL. When viewed in a plan view, the first regions R1 of the film substrate 100 may be arranged in a first direction D1. In some example embodiments, the first regions R1 may be collectively referred to as a single first region R1. The first direction D1 may be parallel to a top surface of an interconnection substrate 200. A second direction D2 may be parallel to the top surface of the interconnection substrate 200 but may not be parallel to (e.g., may be perpendicular or substantially perpendicular to) the first direction D1. A third direction D3 may be perpendicular or substantially perpendicular to the top surface of the interconnection substrate 200. The second region R2 of the film substrate 100 may be provided to enclose the first regions R1. The first regions R1 of the film substrate 100 may be regions, which will be used as packages, and the second region R2 of the film substrate 100 may be a region, which will be removed.

In a fingerprint sensor package 10, the cut-lines CL may be imaginary lines. The cut-lines CL of the film substrate 100 may be provided between the first regions R1 and the second region R2 of the film substrate 100 to define the first regions R1 of the film substrate 100.

The film substrate 100 may have holes 190. For example, the film substrate 100 may have one or more inner surfaces 100s that at least partially define one or more holes 190 penetrating (e.g., extending) through a thickness of the film substrate 100 (e.g., extending completely through the thickness between opposite surfaces of the film substrate 100). When viewed in a plan view, the holes 190 may be provided in the second region R2 of the film substrate 100. For example, the holes 190 may be provided in an edge region of the film substrate 100. The holes 190 may be arranged in the first direction D1. The holes 190 may be provided to penetrate the film substrate 100. The holes 190 may be used to roll the fingerprint sensor package 10. This may make it possible to facilitate a process of transferring the fingerprint sensor package 10.

The film substrate 100 may have alignment keys 170. The alignment keys 170 may be provided on the second region R2 of the film substrate 100. In some example embodiments, the alignment keys 170 may be alignment key holes which may be at least partially defined by one or more inner surfaces of the film substrate 100, similarly to one or more inner surfaces 100s at least partially defining one or more holes 190. For example, the alignment keys 170 may be provided to penetrate the film substrate 100 from top and bottom. In a process of cutting the film substrate 100, positions of the alignment keys 170 may be inspected to determine positions of the cut-lines CL of the film substrate 100. During the cutting process, the film substrate 100 may be cut along the cut-lines CL of the film substrate 100.

The fingerprint sensor packages 10 may include the first regions R1 of the film substrate 100 and the fingerprint sensors 20. The fingerprint sensors 20 may be disposed on the first regions R1 of the film substrate 100. The fingerprint sensors 20 may be laterally spaced apart from each other. The fingerprint sensors 20 may be arranged in the first direction D1. Here, the expression "two elements are laterally spaced apart from each other" may mean that the elements are horizontally (e.g., laterally) spaced apart from each other (e.g., horizontally isolated from direct contact with each other). The term "horizontal or horizontally" may be used to represent a direction parallel to the top surface of the interconnection substrate 200. Each of the fingerprint sensors 20 may include the interconnection substrate 200, a semiconductor chip 300, a passive device 400, conductive structures 500, and an interposer substrate 700. For example, each of the fingerprint sensors 20 may include a separate interconnection substrate 200, a separate semiconductor chip 300, a separate passive device 400, a separate set of conductive structures 500, and a separate interposer substrate 700. In each fingerprint sensor 20, the conductive structures 500 may include first conductive structures 510 and second conductive structures 520. The interposer substrate 700 may include first sensing patterns 710 and second sensing patterns 720 that may be vertically spaced apart from the top surfaces of the first sensing patterns 710. The fingerprint sensor packages 10 may be connected to each other through the second region R2 of the film substrate 100. The process of cutting the film substrate 100 may be performed before mounting at least one of the fingerprint sensor packages 10 on a lower substrate 1000, which will be described with reference to FIGS. 5A to 5C. If the process of cutting the film substrate 100 is finished, the second region R2 of the film substrate 100 may be removed, and the fingerprint sensor packages 10 may be separated from each other. Hereinafter, one of the fingerprint sensor packages 10 will be described in more detail below.

Figure 2A:
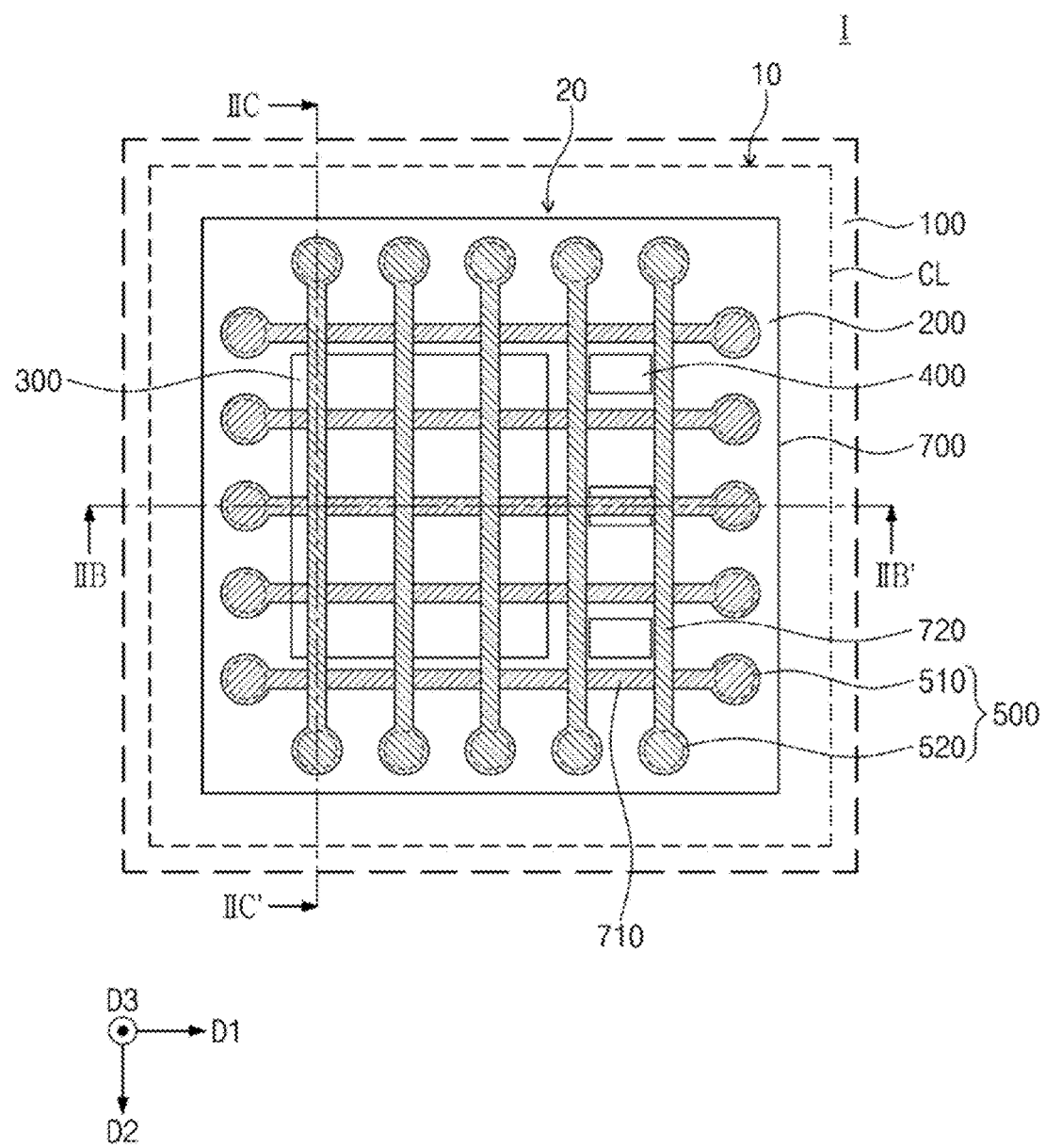
FIG. 2A is a plan view illustrating a fingerprint sensor package according to some example embodiments of the inventive concepts.
Figure 2B:
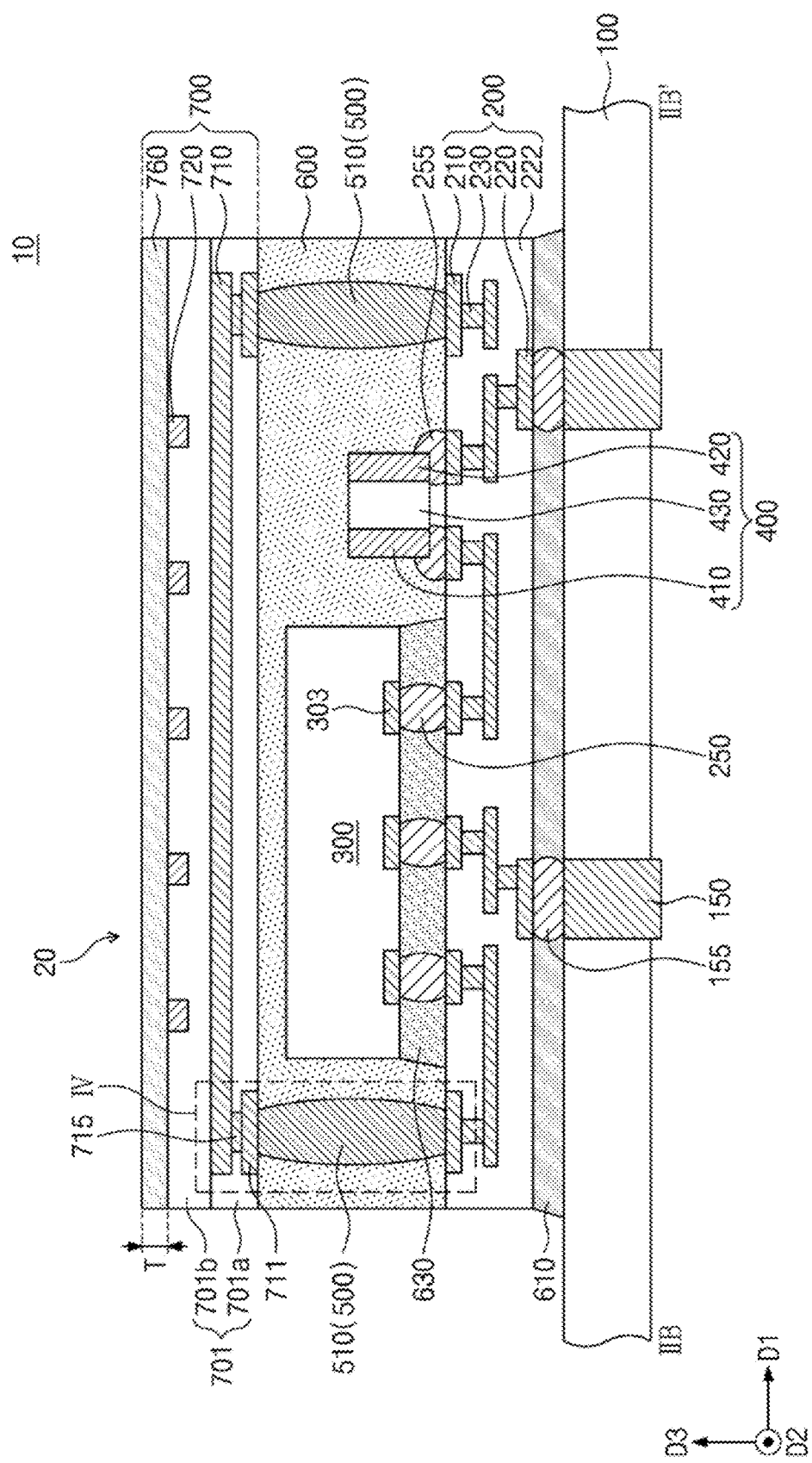
FIG. 2B is a sectional view taken along a line IIB-IIB' of FIG. 2A.
Figure 2C:
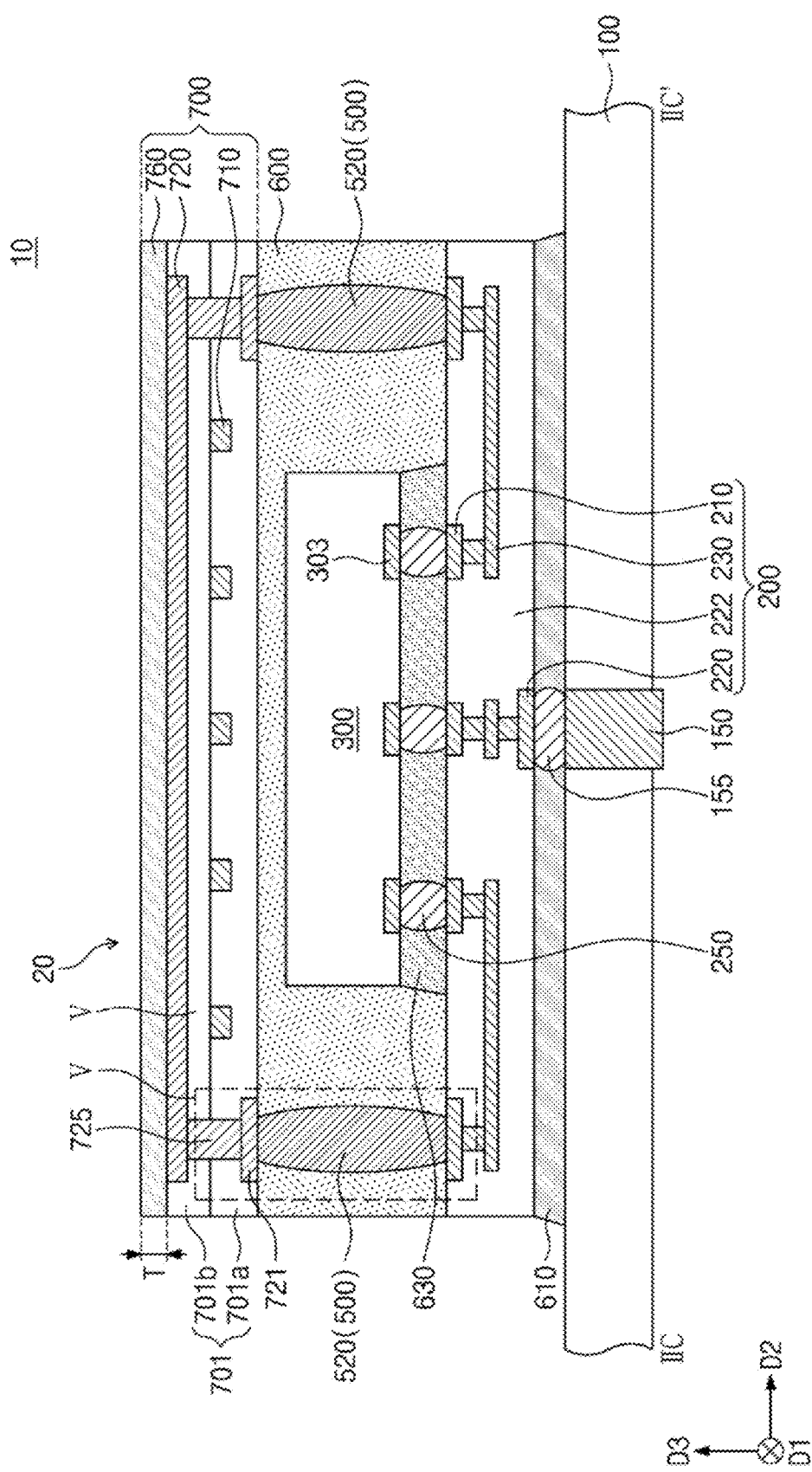
FIG. 2C is a sectional view taken along a line IIC-IIC' of FIG. 2A.

FIG. 2A is an enlarged plan view illustrating a portion of a fingerprint sensor package (e.g., a region I of FIG. 1) according to some example embodiments of the inventive concepts. FIG. 2B is a sectional view taken along a line IIB-IIB' of FIG. 2A. FIG. 2C is a sectional view taken along a line IIC-IIC' of FIG. 2A. For concise description, a previously described element may be identified by the same reference number without repeating an overlapping description thereof.

Referring to FIGS. 2A, 2B, and 2C, the fingerprint sensor package 10 may further include a mold layer 600, in addition to the film substrate 100, the interconnection substrate 200, the semiconductor chip 300, the passive device 400, the conductive structures 500, and the interposer substrate 700. The film substrate 100 may correspond to the first region R1 of the film substrate 100 previously described with reference to FIG. 1. The film substrate 100 may include an insulating material. The film substrate 100 may further include conductive terminals 150. The conductive terminals 150 may be exposed to the outside of the film substrate 100 near a bottom surface of the film substrate 100. Bottom surfaces of the conductive terminals 150 may be provided at a level, which is lower than or equal to the bottom surface of the film substrate 100. The conductive terminals 150 may be provided to further penetrate the film substrate 100 from the top surface to the bottom surface. The conductive terminals 150 may be formed of or include at least one of metallic materials.

One of the fingerprint sensors 20 described with reference to FIG. 1 may be provided on the film substrate 100. Such a fingerprint sensor (e.g., 20 of FIG. 1) may include the interconnection substrate 200, the semiconductor chip 300, the passive device 400, the conductive structures 500, and the interposer substrate 700. The interconnection substrate 200 may be provided on the top surface of the film substrate 100. The interconnection substrate 200 may be, for example, a printed circuit board (PCB). The interconnection substrate 200 may include first substrate pads 210, second substrate pads 220, a material layer 222 (e.g., a layer comprising an insulating material, for example a silicon oxide such as silicon dioxide, silicon nitride, or the like) and conductive patterns 230. The first substrate pads 210 may be disposed on the top surface of the interconnection substrate 200. The second substrate pads 220 may be provided on a bottom surface of the interconnection substrate 200. The conductive patterns 230 may be provided in the interconnection substrate 200. At least two first substrate pads 210 may be electrically connected to each other by one of the conductive patterns 230. One of the first substrate pads 210 may be electrically connected to a corresponding one of the second substrate pads 220 by another one of the conductive patterns 230. The first substrate pads 210, the second substrate pads 220, and the conductive patterns 230 may be formed of or include at least one of metallic materials (e.g., copper).

The fingerprint sensor package 10 may further include connection solders 155 and a lower under-fill layer 610. The connection solders 155 may be interposed between the film substrate 100 and the interconnection substrate 200 and may be coupled to the conductive terminals 150 and the second substrate pads 220. The connection solders 155 may be formed of or include at least one of solder materials. For example, the solder materials may include tin, bismuth, lead, silver, or alloys thereof.

The lower under-fill layer 610 may be provided in a gap region between the film substrate 100 and the interconnection substrate 200 to cover side surfaces of the connection solders 155. The lower under-fill layer 610 may be formed of or include an insulating polymer (e.g., an epoxy polymer).

The semiconductor chip 300 may be mounted on the top surface of the interconnection substrate 200. For example, the semiconductor chip 300 may include chip pads 303 provided near a bottom surface thereof. The chip pads 303 may be electrically connected to integrated circuits (not shown) of the semiconductor chip 300. An expression "an element is electrically connected to the semiconductor chip 300" may mean that the element is electrically connected to integrated circuits of the semiconductor chip 300 through the chip pads 303 of the semiconductor chip 300.

The fingerprint sensor package 10 may further include bumps 250. The bumps 250 may be interposed between the interconnection substrate 200 and the semiconductor chip 300. For example, each of the bumps 250 may be provided between and coupled to a corresponding pair of the first substrate pads 210 and the chip pads 303. Accordingly, the semiconductor chip 300 may be coupled to the interconnection substrate 200 through the bumps 250. The bumps 250 may include solder balls. The bumps 250 may be formed of or include at least one of solder materials. The bumps 250 may further include pillar patterns, and the pillar pattern may be formed of or include a metallic material (e.g., copper).

The fingerprint sensor package 10 may further include an under-fill layer 630. The under-fill layer 630 may be provided in a gap region between the interconnection substrate 200 and the semiconductor chip 300 to cover side surfaces of the bumps 250. The under-fill layer 630 may be formed of or include an insulating polymer (e.g., an epoxy polymer).

The passive device 400 may be mounted on the top surface of the interconnection substrate 200. The passive device 400 may be laterally spaced apart from the semiconductor chip 300. A length of an element may be given by a value measured in a vertical level. A difference in level between two elements may be given by a value measured in the third direction D3. In the present specification, the term 'level' may mean a vertical height and/or a distance from a reference location (e.g., the top surface and/or bottom surface of the film substrate 100, the top surface and/or bottom surface of the interconnection substrate 200, etc.) in a vertical direction (e.g., the third direction D3). For example, when a first element is described herein to be at a higher level than a second element, the first element may be further from the reference location in the vertical direction than the second element. In another example, when a first element is described herein to be at a lower level than a second element, the first element may be closer to the reference location in the vertical direction than the second element. In another example, when a first element is described herein to be at a same level as a second element, the first element may be equally distant from/close to the reference location in the vertical direction as the second element.

The passive device 400 may be, for example, a capacitor. In some example embodiments, the passive device 400 may be an inductor or a resistor. The passive device 400 may include a first conductive terminal 410, a second conductive terminal 420, and an insulating material 430. The first conductive terminal 410 and the second conductive terminal 420 may be a first electrode and a second electrode, respectively. The second conductive terminal 420 may be spaced apart from the first conductive terminal 410. The insulating material 430 may be provided between the first conductive terminal 410 and the second conductive terminal 420. Although not illustrated, the passive device 400 may include an integrated stack capacitor (ISC).

Solder connecting portions 255 may be respectively provided between corresponding pairs of the first conductive terminal 410 and the first substrate pad 210 and between corresponding pairs of the second conductive terminal 420 and the first substrate pad 210. The solder connecting portions 255 may be spaced apart from each other and may be electrically separated from each other. Accordingly, the passive device 400 may be electrically connected to the interconnection substrate 200 and the semiconductor chip 300 through the solder connecting portions 255. For example, a voltage applied to the conductive terminals 150 may be delivered to the interconnection substrate 200. The voltage may be applied to the semiconductor chip 300 via the passive device 400. Accordingly, it may be possible to improve a power integrity (PI) property of the fingerprint sensor package 10. The voltage may be a ground voltage or a power voltage. Elements that are described herein to be electrically separated from each other may also be referred to herein interchangeably as being electrically isolated from each other, electrically disconnected from each other, electrically insulated from each other, or the like.

In some example embodiments, a plurality of passive devices 400 may be provided. For example, as shown in FIG. 2A, the passive devices 400 may be aligned to each other in the second direction D2. The number and arrangement of the passive devices 400 may be variously modified.

The conductive structures 500 may be disposed on the top surface of the interconnection substrate 200. The conductive structures 500 may be disposed on an edge region of the interconnection substrate 200, when viewed in a plan view. The edge region of the interconnection substrate 200 may be provided between a center region of the interconnection substrate 200 and a side surface of the interconnection substrate 200, when viewed in a plan view. The conductive structures 500 may be laterally spaced apart from the semiconductor chip 300 and the passive devices 400. Each of the conductive structures 500 may be formed of or include at least one of solder materials. The conductive structures 500 may be electrically connected to the semiconductor chip 300 or the conductive terminals 150 through the interconnection substrate 200.

The conductive structures 500 may include the first conductive structures 510 and the second conductive structures 520. The second conductive structures 520 may be laterally spaced apart from and electrically separated from the first conductive structures 510.

The mold layer 600 may be provided on the top surface of the interconnection substrate 200 to cover the semiconductor chip 300 and the passive devices 400. The mold layer 600 may be provided to cover side surfaces of the conductive structures 500 but expose top surfaces of the conductive structures 500. The mold layer 600 may be formed of or include an insulating polymer (e.g., an epoxy-based molding compound). The mold layer 600 may be formed of or include a material different from the under-fill layer 630, but the inventive concepts is not limited to this example.

The interposer substrate 700 may be disposed on the mold layer 600 and the conductive structures 500. The interposer substrate 700 may be on both the semiconductor chip 300 and the conductive structures 500. The interposer substrate 700 may be electrically connected to the conductive structures 500. In some example embodiments, the interposer substrate 700 may include an insulating layer 701 and a protection layer 760, in addition to the first and second sensing patterns 710 and 720. As shown in FIGS. 2A to 6B, insulating layer 701 may include a plurality of insulating layers, for example two or more of insulating layers 701a, 701b, or 701c which are vertically stacked. The insulating layers, for example two or more of insulating layers 701a, 701b, or 701c may each be formed of or include at least one of silicon-based insulating materials or insulating polymers. For example, the insulating layer 701 and/or one or more of the insulating layers thereof (e.g., one or more of insulating layers 701a, 701b, or 701c) may include a silicon oxide such as silicon dioxide, silicon nitride, or the like.

The first sensing patterns 710 may be provided on one of the insulating layers 701. The first sensing patterns 710 may have long axes (also referred to herein as longitudinal axes) elongated in the first direction D1, as shown in FIG. 2A. For example, the first sensing patterns 710 may extend in parallel in the first direction D1. The first sensing patterns 710 may be spaced apart from each other in the second direction D2. As shown in FIG. 2B, the first sensing patterns 710 may be electrically connected to the first conductive structures 510, respectively. For example, the interposer substrate 700 may further include first conductive pads 711 and first conductive vias 715. The first conductive pads 711 may be exposed to the outside of the interposer substrate 700 near a bottom surface of the interposer substrate 700. The first conductive pads 711 may be provided on the first conductive structures 510, respectively. The first conductive vias 715 may be provided to penetrate at least one the insulating layer 701. The first conductive vias 715 may be provided on an edge region of the interposer substrate 700, when viewed in a plan view. The first conductive vias 715 may be interposed between the first conductive pads 711 and the first sensing patterns 710. The first sensing patterns 710 may be electrically connected to the first conductive structures 510 through the first conductive vias 715 and the first conductive pads 711. In some example embodiments, the first conductive pads 711 and the first conductive vias 715 may be omitted, and the first sensing patterns 710 may be directly coupled to the first conductive structures 510. The first sensing patterns 710, the first conductive vias 715, and the first conductive pads 711 may be formed of or include at least one of metallic materials. The first sensing patterns 710 may be first conductive lines. For example, the first sensing patterns 710 may be Rx lines, which are used to receive information on a fingerprint.

The second sensing patterns 720 may be provided on another one of the insulating layers 701. The second sensing patterns 720 may be provided on top surfaces of the first sensing patterns 710 and may be vertically spaced apart from the top surfaces of the first sensing patterns 710. The term "vertical or vertically" may be used to represent a direction parallel to the third direction D3. The second sensing patterns 720 may be electrically separated from the first sensing patterns 710. At least one of the insulating layers 701 may be interposed between the first and second sensing patterns 710 and 720. The second sensing patterns 720 may have long axes (also referred to herein as longitudinal axes) elongated in the second direction D2, as shown in FIG. 2A. For example, the second sensing patterns 720 may extend in parallel in the second direction D2. The second sensing patterns 720 may be spaced apart from each other in the first direction D1. As shown in FIG. 2C, the second sensing patterns 720 may be electrically connected to the second conductive structures 520, respectively. For example, the interposer substrate 700 may further include second conductive pads 721 and second conductive vias 725. For example, the second conductive pads 721 may be exposed to the outside of the interposer substrate 700 near the bottom surface of the interposer substrate 700. The second conductive pads 721 may be provided on the second conductive structures 520, respectively. The second conductive vias 725 may be interposed between and coupled to the second conductive pads 721 and the second sensing patterns 720. Accordingly, the second sensing patterns 720 may be electrically connected to the second conductive structures 520 through the second conductive vias 725 and the second conductive pads 721. The second conductive vias 725 may be provided on the edge region of the interposer substrate 700, when viewed in a plan view. The second sensing patterns 720, the second conductive vias 725, and the second conductive pads 721 may be formed of or include at least one of metallic materials. The second sensing patterns 720 may be second conductive lines. The second sensing patterns 720 may be Tx lines, which are used to transmit information on a fingerprint. The electric connection structure between the second sensing patterns 720 and the second conductive structures 520 may be variously changed.

As shown in FIG. 2A, the first and second sensing patterns 710 and 720 may be disposed to cross each other. For example, when viewed in a plan view, the first and second sensing patterns 710 and 720 may be disposed to form a plurality of intersection points. The intersection points may be arranged in rows and columns to form an array, when viewed in a plan view. Although not shown, the interposer substrate 700 may include a plurality of sensing pixels. The intersection points may be provided in the sensing pixels, respectively. Accordingly, information on a fingerprint of a user may be recognized by the sensing pixels. The fingerprint sensing process will be described in more detail with reference to the example of FIG. 5D.

Referring to FIGS. 2B and 2C, the protection layer 760 may be provided on the uppermost the insulating layer 701 and the second sensing patterns 720 to cover the second sensing patterns 720. A user may create a touch event on a top surface of the protection layer 760. For example, the top surface of the protection layer 760 may be a touching surface, which is touched by the user. The protection layer 760 may be formed of or include at least one of insulating polymers (e.g., solder resist materials). In the case where a thickness T of the protection layer 760 is smaller than 10 µm, the second sensing patterns 720 or the first sensing patterns 710 may be damaged. In the case where the thickness T of the protection layer 760 is larger than 30 µm, the sensitivity of the sensor may be deteriorated. In some example embodiments, the protection layer 760 may have the thickness T ranging from 10 µm to 30 µm. For example, the thickness T of the protection layer 760 may range from 10 µm to 20 µm. It may be possible to improve the durability and sensing sensitivity of the fingerprint sensor package 10. For example, the first and second sensing patterns 710 and 720 may be prevented from being damaged, or such damage may be reduced.

Unlike that shown in FIGS. 2A to 2C, the first sensing patterns 710 may have long axes (also referred to herein as longitudinal axes), which are parallel to the second direction D2, and may be spaced apart from each other in the first direction D1. The second sensing patterns 720 may have long axes (also referred to herein as longitudinal axes), which are parallel to the first direction D1, and may be spaced apart from each other in the second direction D2.

Hereinafter, the first and second conductive structures 510 and 520 according to some example embodiments of the inventive concepts will be described in more detail with reference to FIGS. 2D and 2E.

Figure 2D:
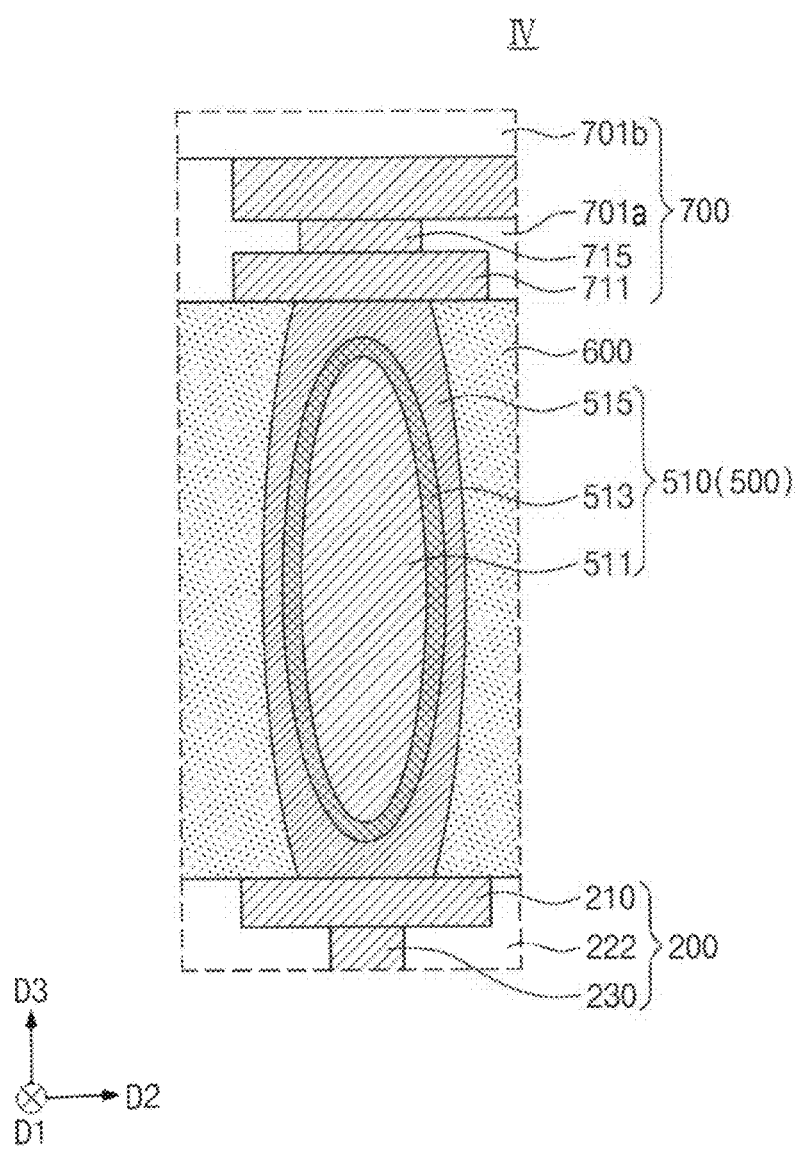
FIG. 2D is a sectional view illustrating a first conductive structure according to some example embodiments of the inventive concepts.

FIG. 2D is an enlarged sectional view illustrating a first conductive structure according to some example embodiments of the inventive concepts and corresponding to a region 'IV' of FIG. 2B. One of the first conductive structures 510 will be described with reference to FIG. 2D, but the inventive concepts is not limited to this example.

Referring to FIG. 2D, the first conductive structure 510 may have a core solder ball structure. For example, the first conductive structure 510 may include a first core portion 511, a first conductive adhesive portion 513, and a first solder portion 515. The first core portion 511 may be formed of or include a first metal (e.g., copper). The first solder portion 515 may be provided to enclose the first core portion 511. The first solder portion 515 may be directly bonded to a corresponding one of the first substrate pads 210 and a corresponding one of the first conductive pads 711. The first solder portion 515 may be formed of or include at least one of solder materials. The first conductive adhesive portion 513 may be provided between the first core portion 511 and the first solder portion 515. The first conductive adhesive portion 513 may attach the first solder portion 515 to the first core portion 511. The first conductive adhesive portion 513 may be formed of or include a second metal. The second metal may be different from the first metal and the first solder portion 515. For example, the second metal may include nickel. In some example embodiments, the first conductive adhesive portion 513 may be omitted, and the first solder portion 515 may be in direct contact with the first core portion 511.

Since the first conductive structure 510 includes the first core portion 511, it may be possible to prevent the first conductive structure 510 from being damaged by an external stress, or such damage may be reduced. A melting point of the first core portion 511 may be higher than a melting point of the first solder portion 515. As an example, a process of mounting the interposer substrate 700 may be performed at a process temperature which is equal to or higher than the melting point of the first solder portion 515. Since the first conductive structure 510 includes the first core portion 511, it may be possible to control the height and shape of the first conductive structure 510 in a uniform or substantially uniform manner, during the mounting process of the interposer substrate 700. Accordingly, it may be possible to secure a distance between the interposer substrate 700 and the interconnection substrate 200.

Figure 2E:
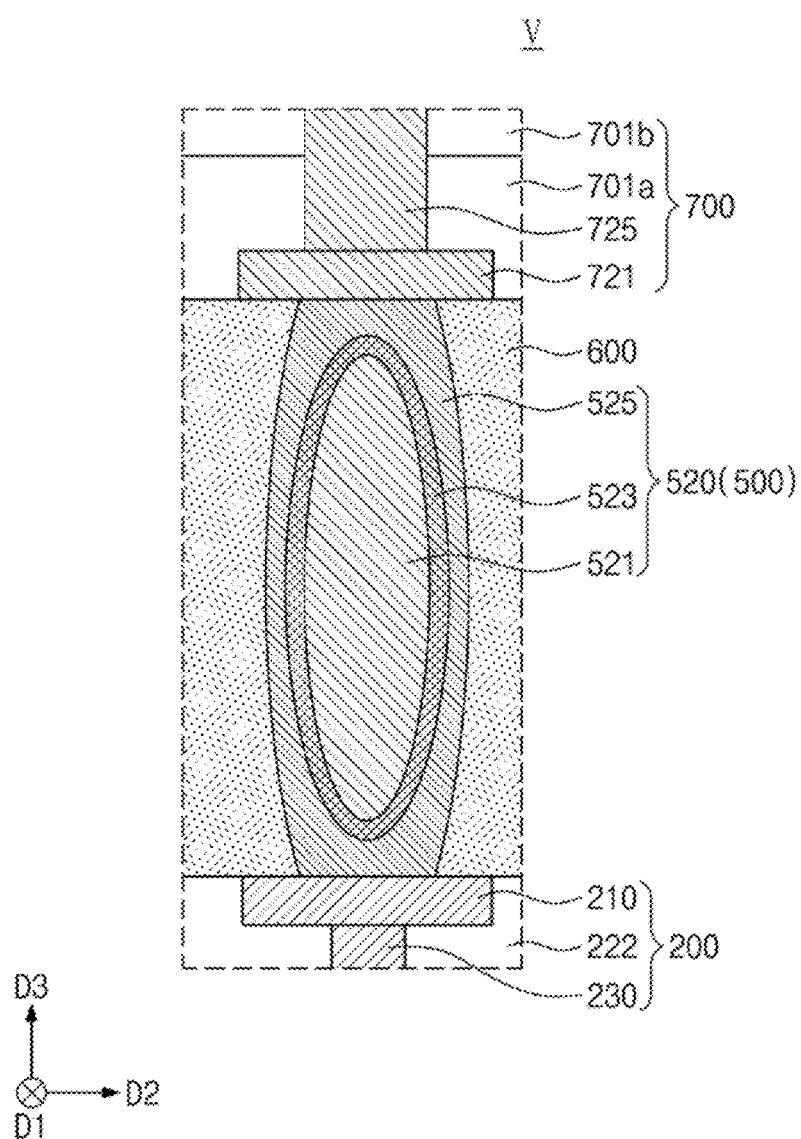
FIG. 2E is a sectional view illustrating a second conductive structure according to some example embodiments of the inventive concepts.

FIG. 2E is a sectional view illustrating a second conductive structure according to some example embodiments of the inventive concepts and corresponding to a region 'V' of FIG. 2C. A single second conductive structure is illustrated in FIG. 2E, but the inventive concepts is not limited to this example.

Referring to FIG. 2E, the second conductive structure 520 may have a core solder ball structure. For example, the second conductive structure 520 may include a second core portion 521, a second conductive adhesive portion 523, and a second solder portion 525. The second core portion 521 may be formed of or include at least one of metallic materials (e.g., copper). The second solder portion 525 may be provided to enclose the second core portion 521. The second solder portion 525 may be directly bonded to a corresponding one of the second substrate pads 220 and a corresponding one of the second conductive pads 721. The second solder portion 525 may be formed of or include at least one of solder materials. The second core portion 521 may have a melting point that is higher than the second solder portion 525. The second conductive adhesive portion 523 may be provided between the second core portion 521 and the second solder portion 525. The second conductive adhesive portion 523 may attach the second solder portion 525 to the second core portion 521. The second conductive adhesive portion 523 may be formed of or include a metallic material different from the second core portion 521 and the second solder portion 525. For example, the second conductive adhesive portion 523 may be formed of or include a metallic material such as nickel. As another example, the second conductive adhesive portion 523 may be omitted, and the second solder portion 525 may be in direct contact with the second core portion 521.

According to some example embodiments of the inventive concepts, since the second conductive structure 520 includes the second core portion 521, it may be possible to prevent the second conductive structure 520 from being damaged by an external stress, or such damage may be reduced. In addition, it may be possible to control a height and shape of the second conductive structure 520 in the mounting process of the interposer substrate 700 in a uniform or substantially uniform manner.

The second core portion 521, the second conductive adhesive portion 523, and the second solder portion 525 may be respectively formed of or include the same materials as the first core portion 511, the first conductive adhesive portion 513, and the first solder portion 515 described with reference to FIG. 2D.

Figure 3A:
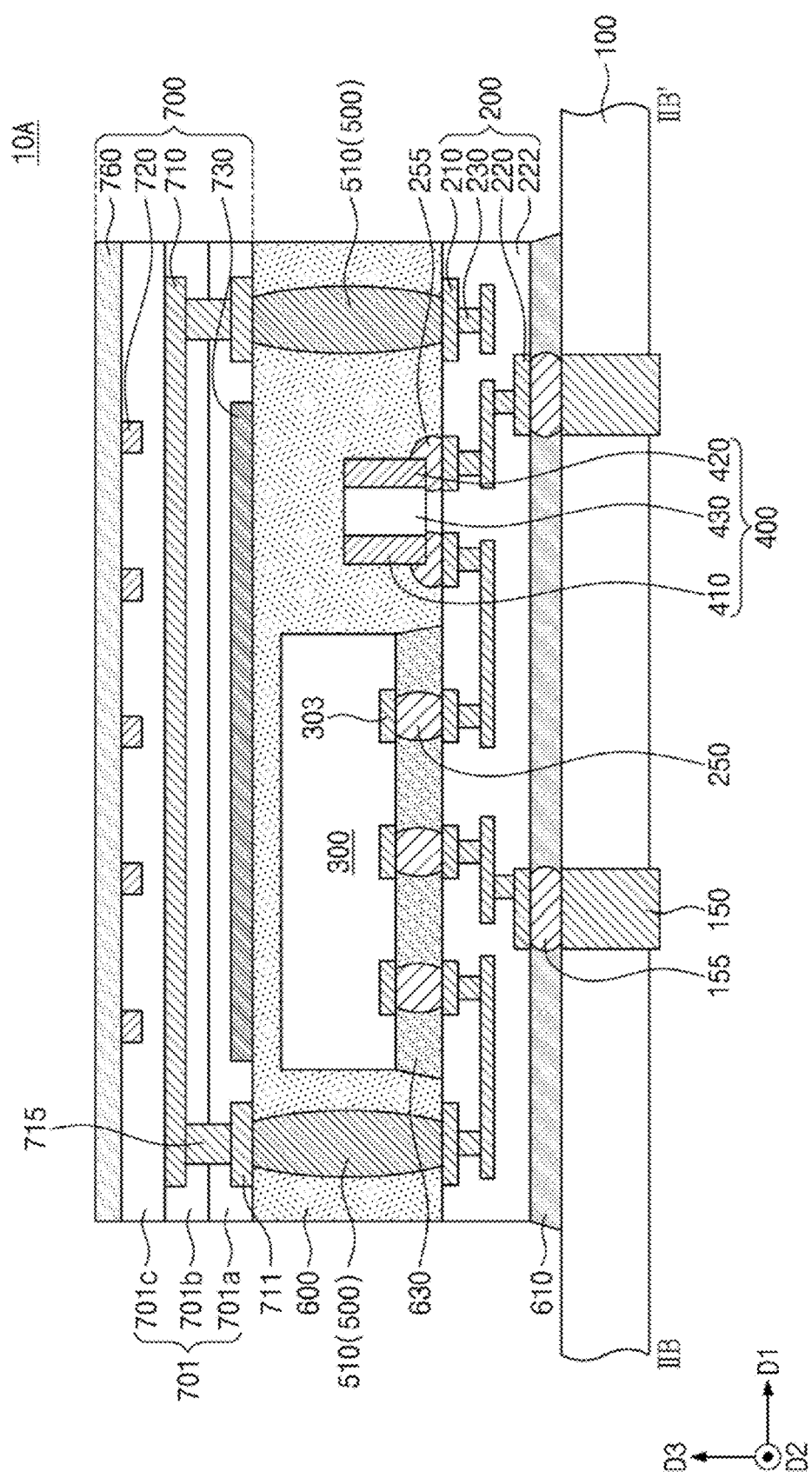
FIGS. 3A and 3B are sectional views illustrating a fingerprint sensor package according to some example embodiments of the inventive concepts.
Figure 3B:
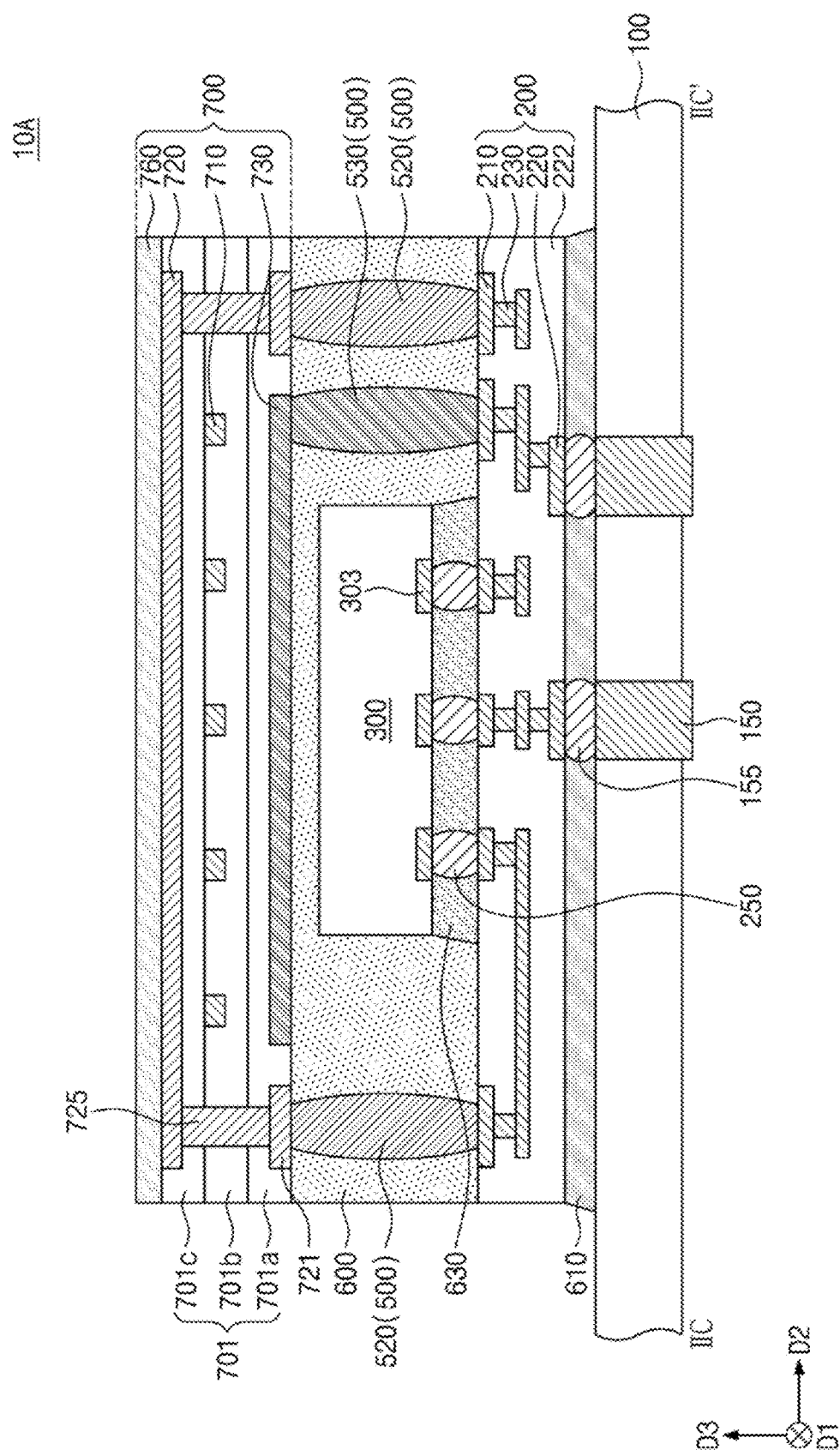

FIGS. 3A and 3B are sectional views, which are respectively taken along lines IIB-IIB' and IIC-IIC' of FIG. 2A to illustrate a fingerprint sensor package according to some example embodiments of the inventive concepts. For concise description, a previously described element may be identified by the same reference number without repeating an overlapping description thereof.

Referring to FIGS. 3A and 3B, a fingerprint sensor package 10A may include the film substrate 100, the interconnection substrate 200, the semiconductor chip 300, the passive device 400, the conductive structures 500, the mold layer 600, and the interposer substrate 700.

As shown in FIG. 3B, the conductive structures 500 may further include a third conductive structure 530, in addition to the first conductive structures 510 and the second conductive structures 520. The third conductive structure 530 may be laterally spaced apart from the first conductive structures 510 and the second conductive structures 520. The third conductive structure 530 may be a ground conductive structure.

The interposer substrate 700 may further include a ground pattern 730, in addition to the insulating layers 701, the first sensing patterns 710, the second sensing patterns 720, and the protection layer 760. The interposer substrate 700 may further include the first and second conductive pads 711 and 721 and the first and second conductive vias 715 and 725.

The ground pattern 730 may be interposed between the bottom surface of the interposer substrate 700 and the bottom surfaces of the first sensing patterns 710. The ground pattern 730 may be understood to be on (e.g., above or beneath) the bottom surfaces of the first sensing patterns 710 and may be understood to be vertically spaced apart from the bottom surfaces of the first sensing patterns 710. The ground pattern 730 may be spaced apart from and electrically separated from the first conductive vias 715 and the first sensing patterns 710. A bottom surface of the ground pattern 730 may be provided at the same or substantially the same level (e.g., same or substantially same distance in the third direction D3 from a reference location, such as a top surface and/or a bottom surface of the interconnection substrate 200) as bottom surfaces of the first and second conductive pads 711 and 721. As an example, the ground pattern 730 may be exposed to the outside (e.g., the exterior) of the interposer substrate 700 near the bottom surface of the interposer substrate 700.

As shown in FIG. 3B, the ground pattern 730 may be electrically connected to the third conductive structure 530. Accordingly, a ground voltage may be applied to the ground pattern 730 through the third conductive structure 530. Due to the presence of the ground pattern 730, it may be possible to reduce or prevent a noise coupling issue between the first and second sensing patterns 710 and 720 and other elements. The other elements may include the interconnection substrate 200 or the semiconductor chip 300. Accordingly, it may be possible to improve the accuracy and reliability in the sensing process using the fingerprint sensor package 10A.

The electric connection structure between the third conductive structure 530 and the ground pattern 730 may be variously changed. For example, the ground pattern 730 may be coupled to the third conductive structure 530 through another conductive element. For example, the conductive pad or the conductive via may be used to connect the ground pattern 730 to the third conductive structure 530.

Figure 4A:
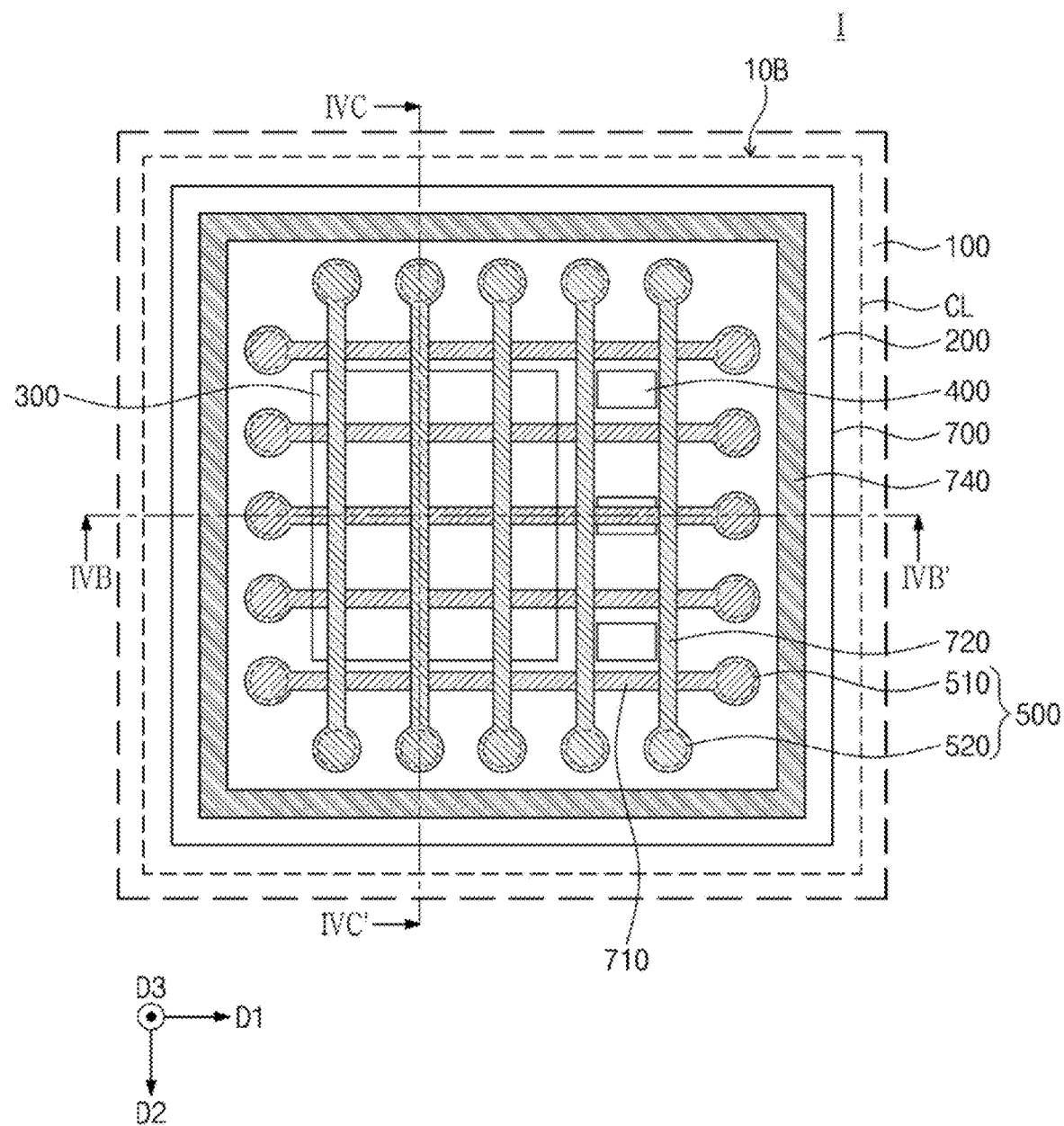
FIG. 4A is a plan view illustrating a fingerprint sensor package according to some example embodiments of the inventive concepts.
Figure 4B:
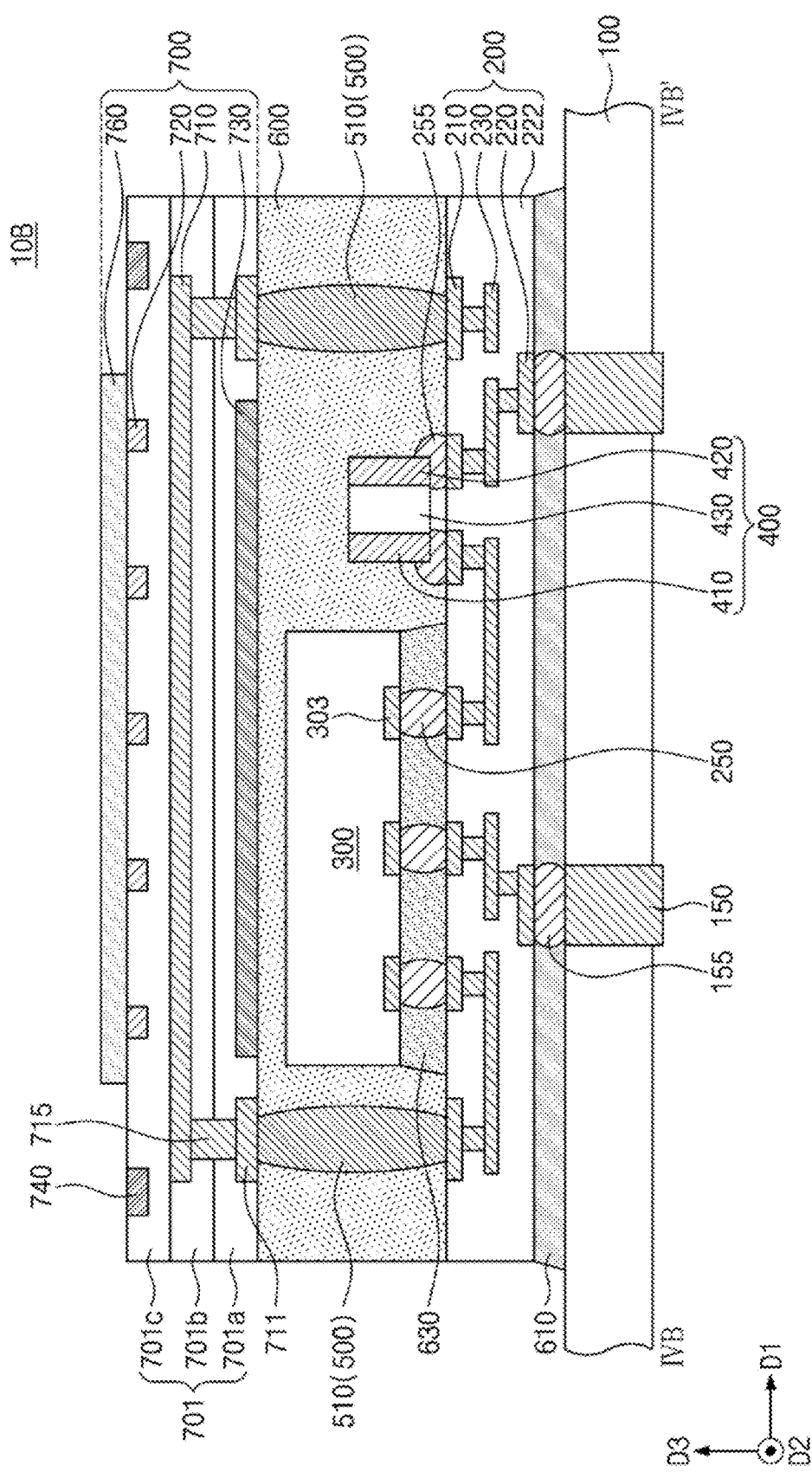
FIG. 4B is a sectional view taken along a line IVB-IVB' of FIG. 4A.
Figure 4C:
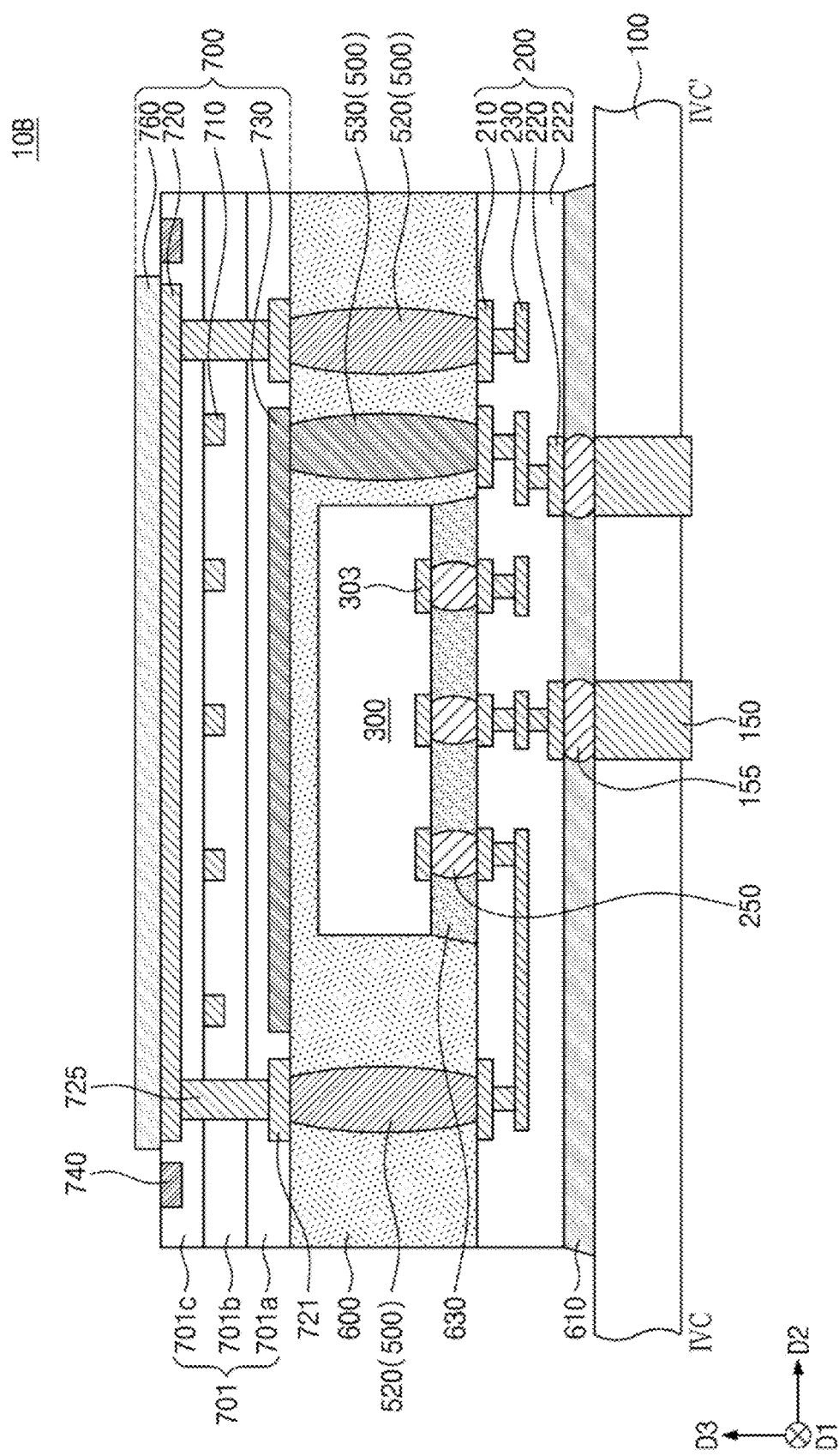
FIG. 4C is a sectional view taken along a line IVC-IVC' of FIG. 4A.

FIG. 4A is a plan view illustrating a fingerprint sensor package according to some example embodiments of the inventive concepts and corresponding to the region 'I' of FIG. 1. FIG. 4B is a sectional view taken along a line IVB-IVB' of FIG. 4A. FIG. 4C is a sectional view taken along a line IVC-IVC' of FIG. 4A. For concise description, a previously described element may be identified by the same reference number without repeating an overlapping description thereof.

Referring to FIGS. 4A, 4B, and 4C, the fingerprint sensor package 10B may include the film substrate 100, the interconnection substrate 200, the semiconductor chip 300, the passive device 400, the first to third conductive structures 510, 520, and 530, the mold layer 600, and the interposer substrate 700. The interposer substrate 700 may further include a ground guide pattern 740, in addition to the insulating layers 701, the first sensing patterns 710, the second sensing patterns 720, the ground pattern 730, and the protection layer 760. The interposer substrate 700 may further include first and second conductive pads 711 and 721 and first and second conductive vias 715 and 725.

The ground guide pattern 740 may be provided on the uppermost the insulating layer 701. The ground guide pattern 740 may be laterally spaced apart from the second sensing patterns 720. As shown in FIG. 4A, the ground guide pattern 740 may be provided to enclose the second sensing patterns 720, when viewed in a plan view. The ground guide pattern 740 may be provided at the same or substantially the same level as the second sensing patterns 720, as shown in FIGS. 4B and 4C. The protection layer 760 may be provided to cover top surfaces of the second sensing patterns 720 but expose a top surface of the ground guide pattern 740.

As an example, the ground guide pattern 740 may be electrically connected to the ground pattern 730 and the third conductive structure 530. In some example embodiments, the conductive structures 500 may further include a fourth conductive structure, and in this case, the ground guide pattern 740 may be electrically connected to the fourth conductive structure. The fourth conductive structure may be interposed between the interconnection substrate 200 and the interposer substrate 700 and may be laterally spaced apart from the semiconductor chip 300. The ground guide pattern 740 may receive a ground voltage through the fourth conductive structure.

In the case where the top surface of the protection layer 760 is touched by a user, information on a fingerprint of a user may be obtained. At this time, the user's finger may be in touch with the ground guide pattern 740. The ground guide pattern 740 may remove a noise signal, which may be produced during the touch event from the user. Accordingly, the accuracy and reliability in the sensing process using the fingerprint sensor package 10B may be further improved.

Figure 4D:
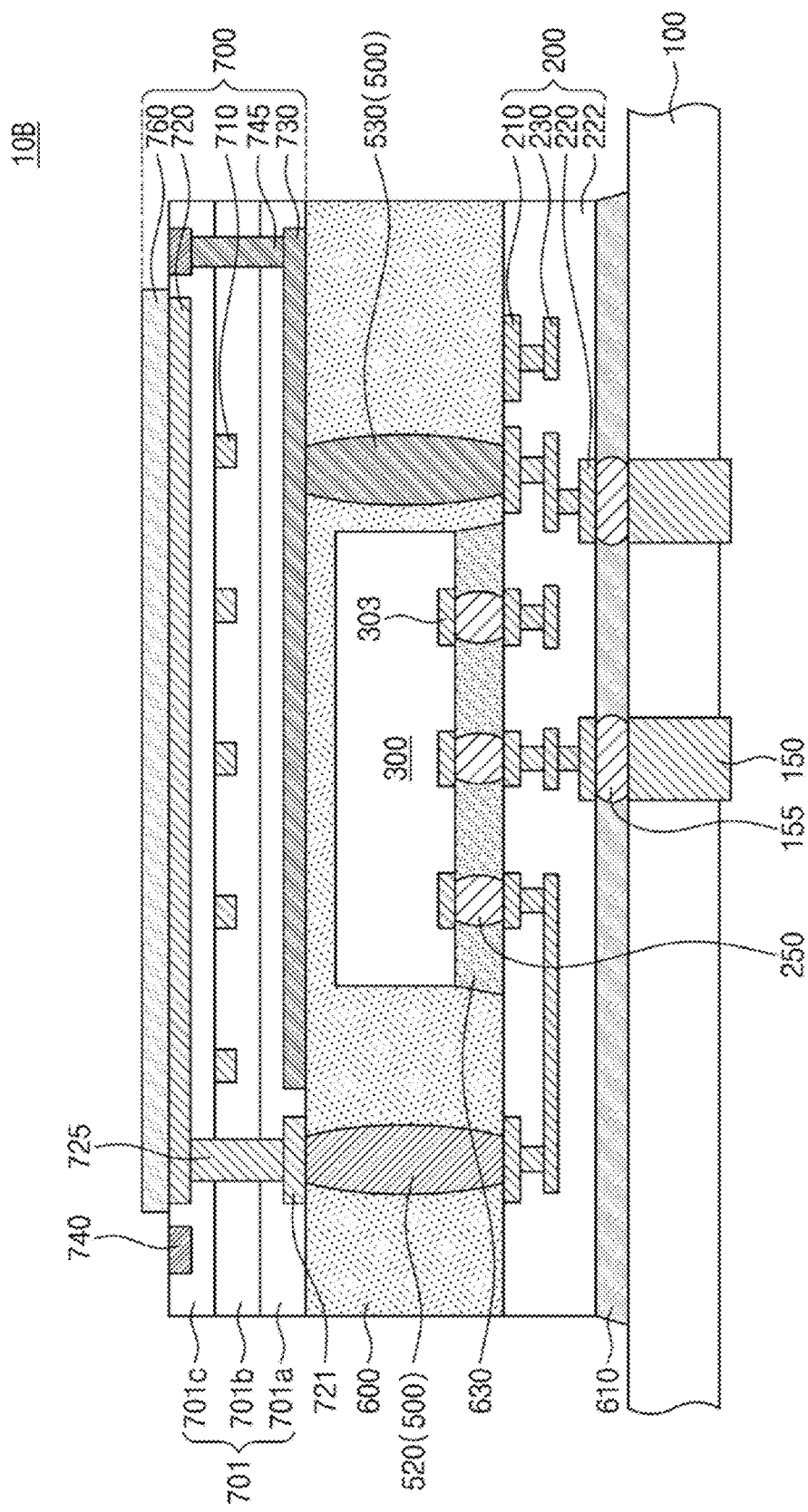
FIG. 4D is a sectional view illustrating an interposer substrate according to some example embodiments of the inventive concepts.

FIG. 4D is a sectional view illustrating an interposer substrate according to some example embodiments of the inventive concepts. The interposer substrate according to some example embodiments may be described with reference to FIG. 4D in conjunction with FIGS. 4A to 4C.

Referring to FIG. 4D, the interposer substrate 700 may include the insulating layers 701, the first sensing patterns 710, the second sensing patterns 720, the ground pattern 730, the ground guide pattern 740, and the protection layer 760. The interposer substrate 700 may further include the first and second conductive pads 711 and 721, the first and second conductive vias 715 and 725, and an upper conductive pattern 745. The upper conductive pattern 745 may include a conductive via. The ground guide pattern 740 may be electrically connected to the ground pattern 730 through the upper conductive pattern 745.

Figure 5A:
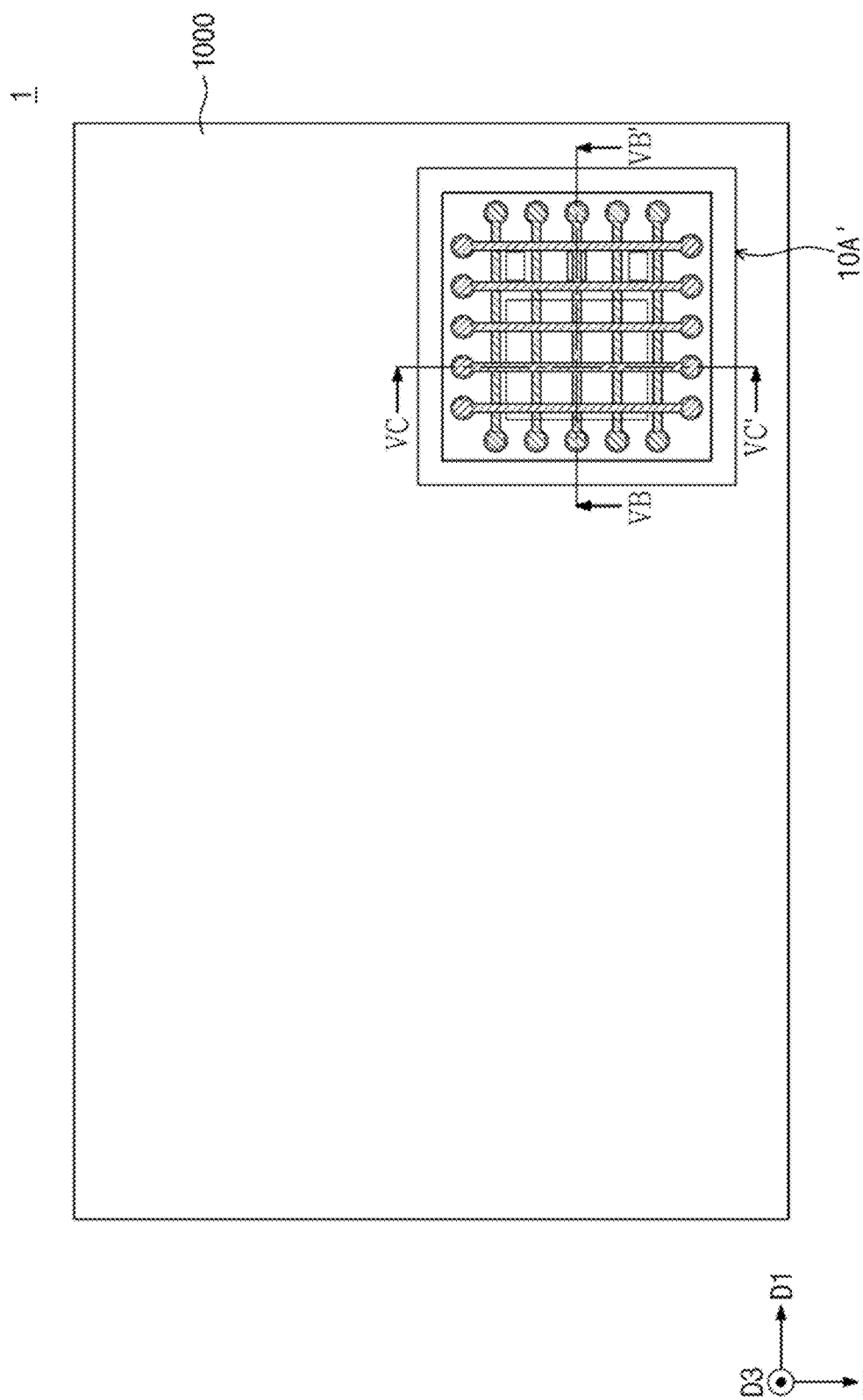
FIG. 5A is a plan view illustrating a fingerprint sensing device according to some example embodiments of the inventive concepts.
Figure 5B:
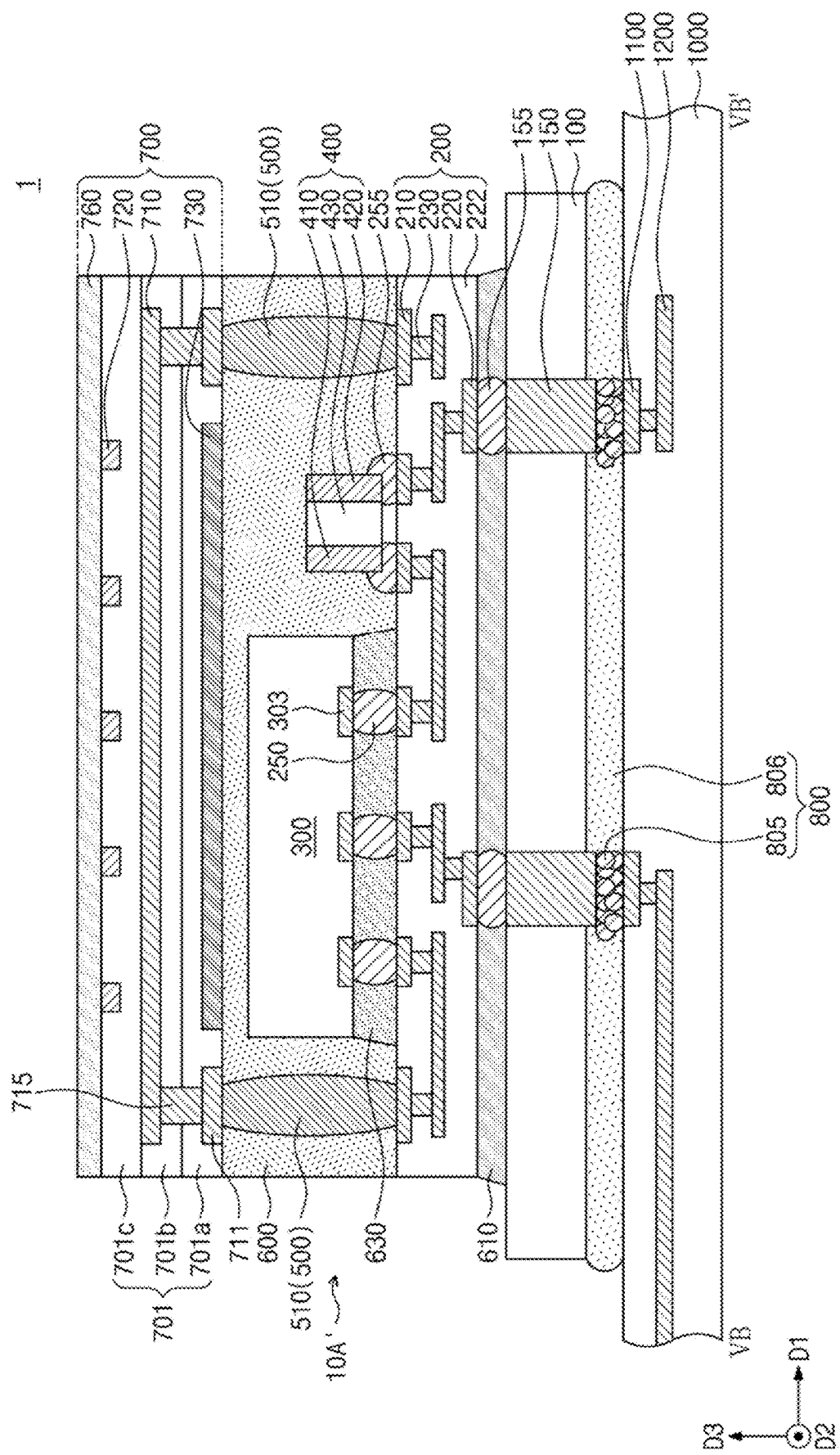
FIG. 5B is a sectional view taken along a line VB-VB' of FIG. 5A.
Figure 5C:
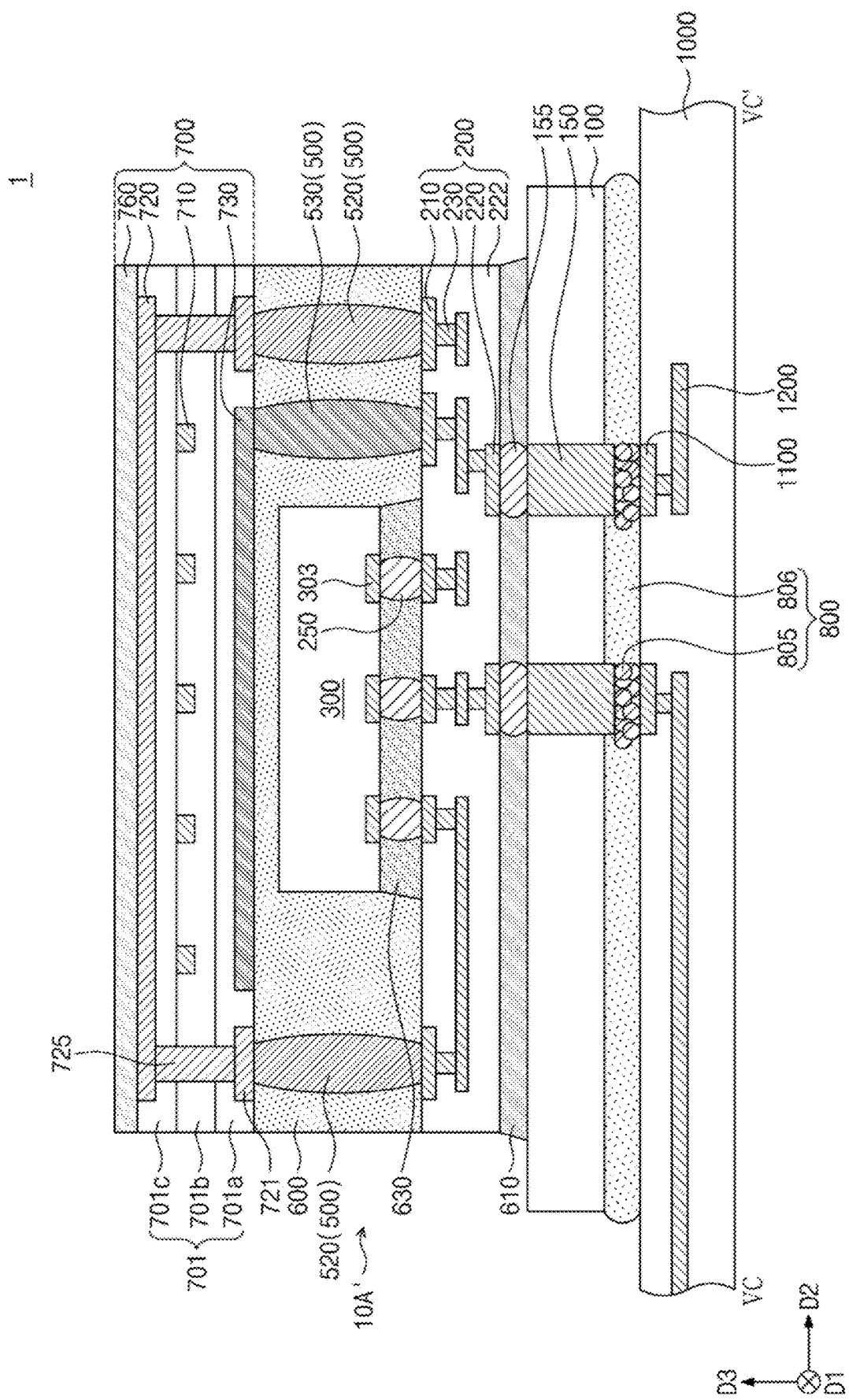
FIG. 5C is a sectional view taken along a line VC-VC" of FIG. 5A.

FIG. 5A is a plan view illustrating a fingerprint sensing device according to some example embodiments of the inventive concepts. FIG. 5B is a sectional view taken along a line VB-VB' of FIG. 5A. FIG. 5C is a sectional view taken along a line VC-VC' of FIG. 5A. For concise description, a previously described element may be identified by the same reference number without repeating an overlapping description thereof.

Referring to FIGS. 5A, 5B, and 5C, a fingerprint sensing device 1 may be a fingerprint sensing card. For example, a credit card may be used as the fingerprint sensing device 1. The fingerprint sensing device 1 may include the lower substrate 1000 and a fingerprint sensor package 10A'. In some example embodiments, the lower substrate 1000 may include a plate of the credit card. The lower substrate 1000 may include bonding pads 1100 and conductive interconnection lines 1200. The bonding pad 1100 may be provided on a top surface of the lower substrate 1000. The conductive interconnection lines 1200 may be provided in the lower substrate 1000 and may be electrically connected to the bonding pads 1100. In some example embodiments, the bonding pads 1100 and the conductive interconnection lines 1200 may be formed of or include at least one of metallic materials.

The fingerprint sensor package 10A' may be mounted on the top surface of the lower substrate 1000. The fingerprint sensor package 10A' may include the film substrate 100, the interconnection substrate 200, the semiconductor chip 300, the passive device 400, the conductive structures 500, the mold layer 600, and the interposer substrate 700. The fingerprint sensor package 10A' may be the same or substantially the same as the fingerprint sensor package 10A described with reference to FIGS. 3A and 3B. Although not illustrated, the fingerprint sensor package 10A' may be the same or substantially the same as the fingerprint sensor package 10 of FIGS. 2A to 2C or the fingerprint sensor package 10B of FIGS. 4A to 4C. In some example embodiments, the interposer substrate 700 may be the same or substantially the same as that in some example embodiments, including the example embodiments shown in FIG. 4D. However, as described with reference to the cutting process of FIG. 1, the film substrate 100 may be cut along the cut-lines CL of the film substrate 100 and may be divided into a plurality of the fingerprint sensor packages 10 separated from each other. One of the fingerprint sensor packages 10 may be mounted on the lower substrate 1000.

The fingerprint sensing device 1 may further include a connection film 800. The connection film 800 may be provided between the lower substrate 1000 and the film substrate 100. For example, an anisotropic conductive film) may be used as the connection film 800. For example, the connection film 800 may include an insulating adhesive film 805 and conductive particles 806. The insulating adhesive film 805 may be formed of or include, for example, a polymer. The conductive particles 806 may be provided in the insulating adhesive film 805. The conductive particles 806 may be provided between the conductive terminals 150 and the bonding pads 1100 and may be electrically connected to the conductive terminals 150 and the bonding pads 1100. Accordingly, the fingerprint sensor package 10A' may be electrically connected to the lower substrate 1000. Although not shown, an electronic device may be further mounted on the lower substrate 1000. Fingerprint information, which is obtained by the fingerprint sensor package 10A', may be delivered to the electronic device through the lower substrate 1000.

Figure 5D:
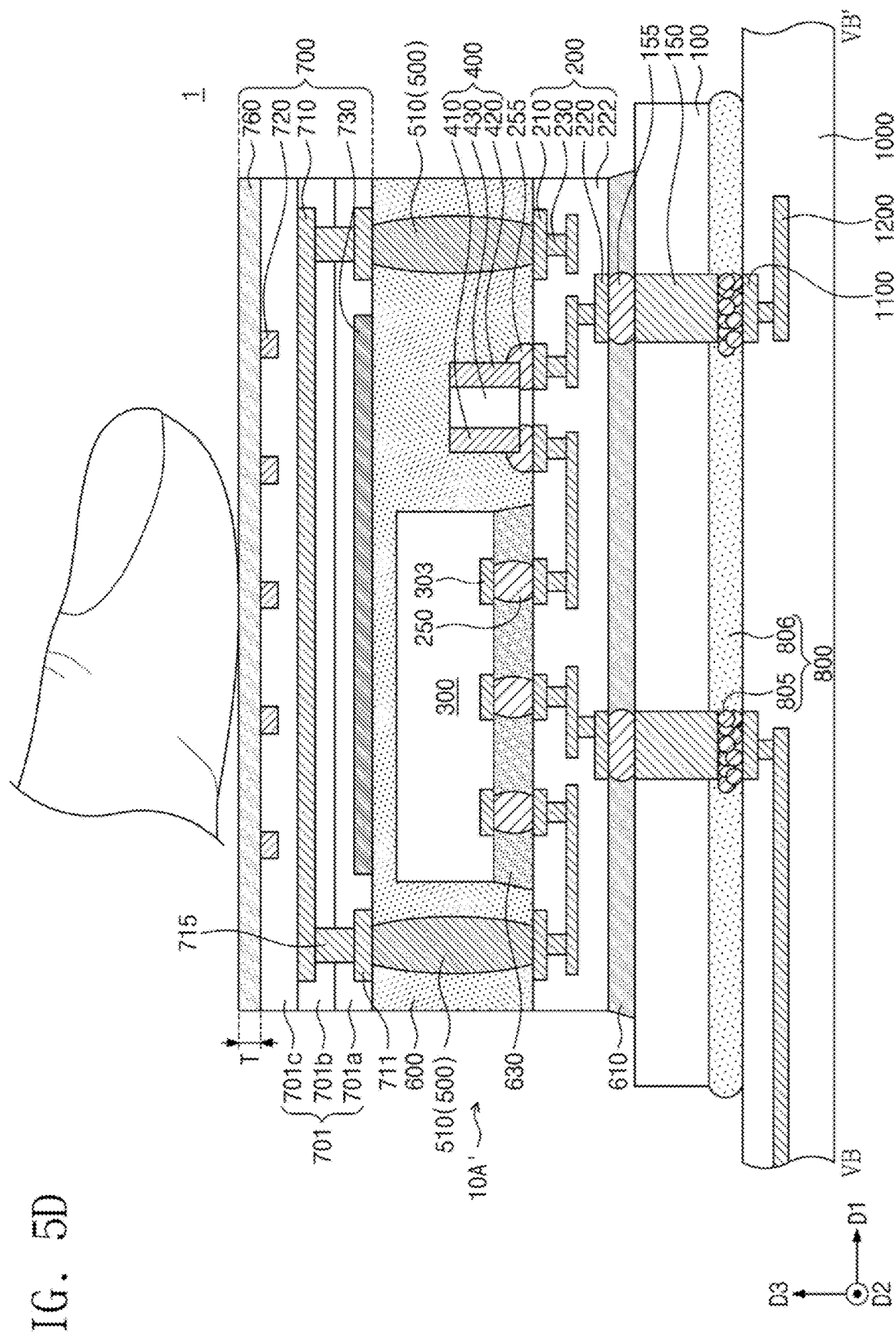
FIG. 5D is a sectional view illustrating a fingerprint sensing process according to some example embodiments of the inventive concepts.

FIG. 5D is a sectional view illustrating a fingerprint sensing process according to some example embodiments of the inventive concepts.

Referring to FIGS. 5A, 5C, and 5D, a user may touch the protection layer 760 of the fingerprint sensor package 10A'. Signals, which are produced at the intersection points of the first and second sensing patterns 710 and 720, may be determined by the arrangement of ridges of a fingerprint. The intersection points may constitute sensing pixels. The intersection points may be provided in the sensing pixels, respectively, as described above. The signals may be transmitted to the semiconductor chip 300 through the conductive structures 500. A fingerprint of the user may be recognized by analyzing the signals.

Since the thickness T of the protection layer 760 ranges from 10 μm to 30 μm, the fingerprint sensor package 10A' may have improved sensing sensitivity, and the first and second sensing patterns 710 and 720 may be prevented from being damaged, or such damage may be reduced.

Figure 6A:
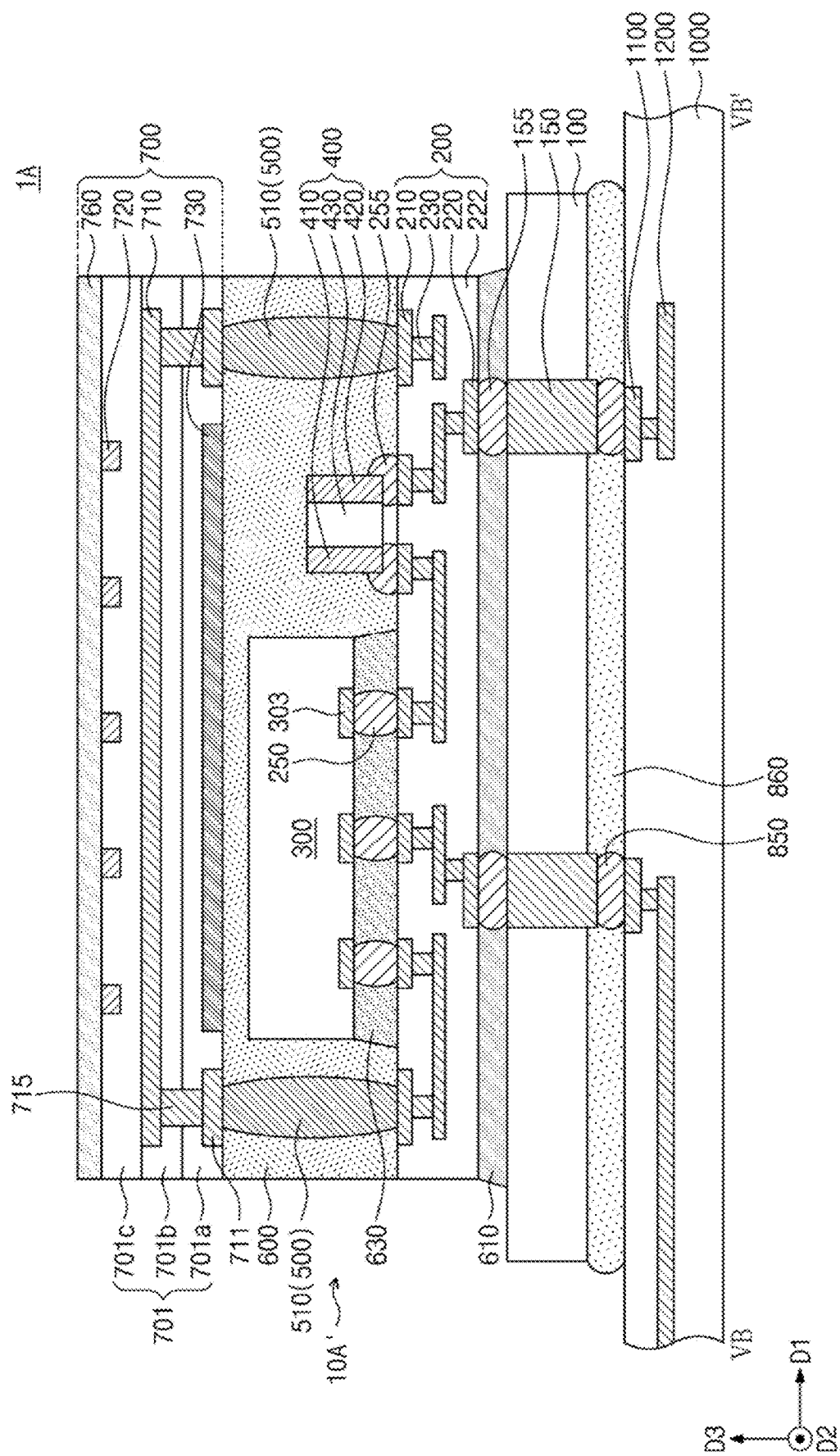
FIGS. 6A and 6B are sectional views illustrating a fingerprint sensing device according to some example embodiments of the inventive concepts.
Figure 6B:
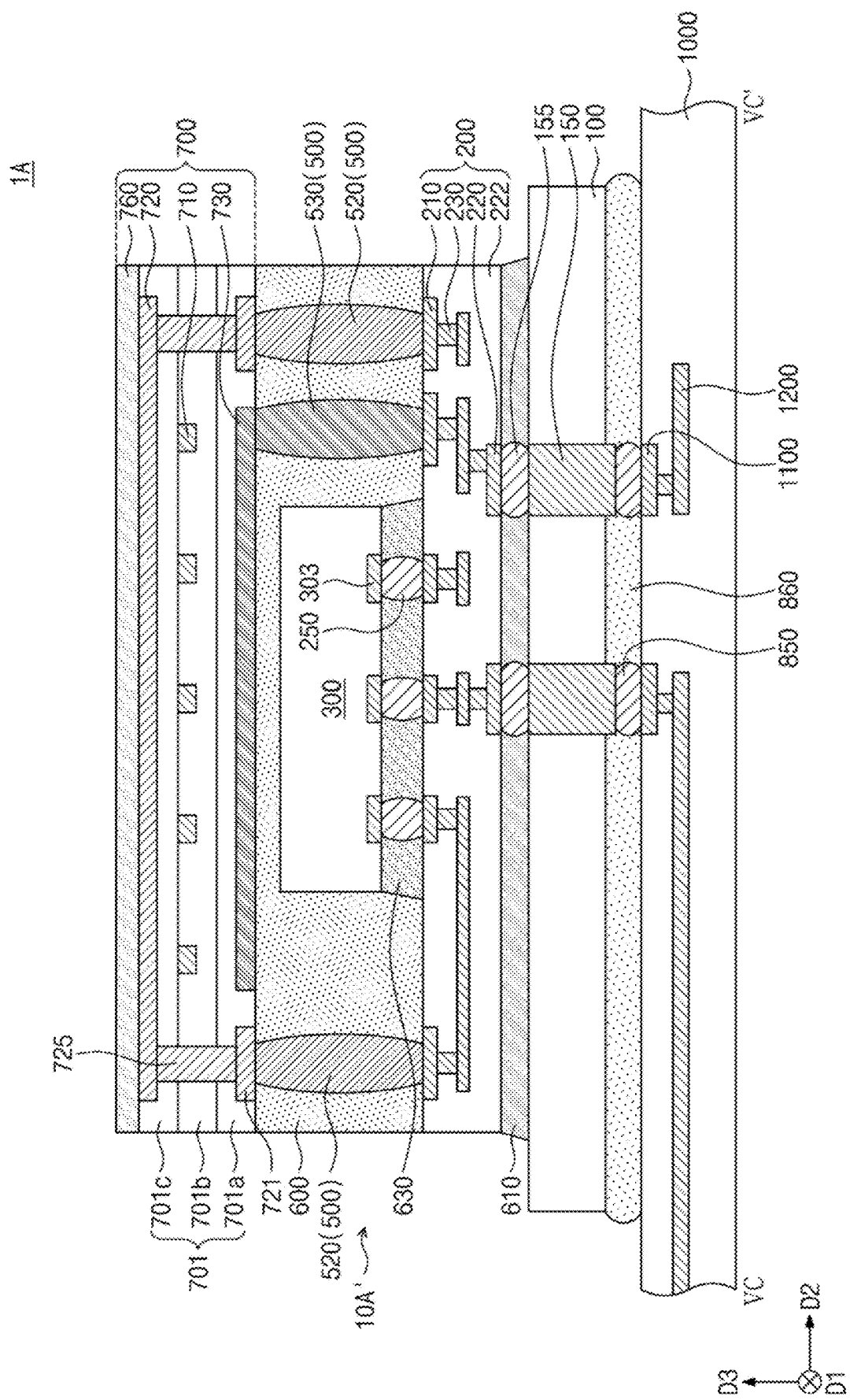

FIGS. 6A and 6B are sectional views, which are respectively taken along a line VB-VB' of FIG. 5A and a line VC-VC' of FIG. 5A to illustrate a fingerprint sensing device according to some example embodiments of the inventive concepts.

Referring to FIGS. 6A and 6B, the fingerprint sensing device 1 may include the lower substrate 1000 and the fingerprint sensor package 10A'. The lower substrate 1000 and the fingerprint sensor package 10A' may be the same or substantially the same as one of the fingerprint sensing devices described with reference to FIGS. 5A to 5D.

However, the fingerprint sensor package 10A' may further include an under-fill pattern 860 and conductive solders 850. The conductive solders 850 may be provided between the conductive terminals 150 and the bonding pads 1100 and may be electrically connected to the conductive terminals 150 and the bonding pads 1100. The conductive solders 850 may include solder balls. The under-fill pattern 860 may be provided between the lower substrate 1000 and the film substrate 100. The under-fill pattern 860 may be provided to seal or encapsulate the conductive solders 850. The under-fill pattern 860 may be formed of or include an insulating polymer.

According to some example embodiments of the inventive concepts, it may be possible to improve the reliability and sensitivity in a sensing process using a fingerprint sensor package.

While example embodiments of the inventive concepts have been particularly shown and described, it will be understood by one of ordinary skill in the art that variations in form and detail may be made therein without departing from the spirit and scope of the attached claims.

What is claimed is:

1. A fingerprint sensor package, comprising:
a film substrate;
an interconnection substrate on the film substrate;
a semiconductor chip on the interconnection substrate;
a conductive structure on the interconnection substrate, the conductive structure laterally isolated from direct contact with the semiconductor chip; and
an interposer substrate on both the semiconductor chip and the conductive structure, such that
the semiconductor chip and the conductive structure are between the interconnection substrate and the interposer substrate in a vertical direction that is perpendicular to a top surface of the interconnection substrate, and the conductive structure and the semiconductor chip at least partially overlap in a horizontal direction that is parallel to the top surface of the interconnection substrate, wherein the conductive structure includes a first conductive structure and a second conductive structure, the first conductive structure and the second conductive structure electrically separated from each other, wherein the interposer substrate includes a first sensing pattern electrically connected to the first conductive structure, and a second sensing pattern on a top surface of the first sensing pattern, the second sensing pattern electrically connected to the second conductive structure such that the first and second sensing patterns are electrically coupled to the interconnection substrate via different conductive structures of the first and second conductive structures, wherein the second sensing pattern is vertically isolated from direct contact with the first sensing pattern, and wherein a longitudinal axis of the second sensing pattern is parallel to a direction crossing a longitudinal axis of the first sensing pattern, when viewed in a plan view, such that at least a portion of the first sensing pattern and at least a portion of the second sensing pattern overlap each other in the vertical direction at an intersection point.

2. The fingerprint sensor package of claim 1, wherein the interposer substrate further comprises a ground pattern, and the ground pattern is on a bottom surface of the first sensing pattern and is electrically disconnected from the first sensing pattern.

3. The fingerprint sensor package of claim 1, wherein the interposer substrate further comprises a ground guide pattern, the ground guide pattern laterally isolated from direct contact with the second sensing pattern.

4. The fingerprint sensor package of claim 3, wherein the ground guide pattern encloses the second sensing pattern, when viewed in the plan view.

5. The fingerprint sensor package of claim 3, wherein the interposer substrate further comprises a protection layer, the protection layer covering the second sensing pattern and exposing the ground guide pattern.

6. The fingerprint sensor package of claim 1, wherein
the interposer substrate further comprises a protection layer covering the second sensing pattern, and
the protection layer has a thickness of 10 μm to 30 μm.

7. The fingerprint sensor package of claim 1, wherein the first conductive structure comprises:
a core portion;
a solder portion enclosing the core portion; and
a conductive adhesive portion between the core portion and the solder portion,
wherein the core portion has a melting point higher than a melting point of the solder portion.

8. The fingerprint sensor package of claim 1, further comprising a passive device, the passive device on the interconnection substrate and between the semiconductor chip and the conductive structure.

9. The fingerprint sensor package of claim 1, further comprising a mold layer, the mold layer between the interconnection substrate and the interposer substrate such that the mold layer covers a side surface of the first conductive structure,
a side surface of the second conductive structure, and
the semiconductor chip.

10. A sensor package, comprising:
a film substrate having a first region and a second region; and
a plurality of fingerprint sensors isolated from direct contact with each other on the film substrate,
wherein each fingerprint sensor of the plurality of fingerprint sensors includes
an interconnection substrate on the first region of the film substrate,
a semiconductor chip on the interconnection substrate,
conductive structures on the interconnection substrate and laterally isolated from direct contact with the semiconductor chip, and
an interposer substrate on both the semiconductor chip and the conductive structures, such that
the semiconductor chip and the conductive structures are between the interconnection substrate and the interposer substrate in a vertical direction that is perpendicular to a top surface of the interconnection substrate, and
the conductive structures and the semiconductor chip at least partially overlap in a horizontal direction that is parallel to the top surface of the interconnection substrate,
wherein the conductive structures include a first conductive structure and a second conductive structure, the first conductive structure and the second conductive structure electrically separated from each other,
wherein the interposer substrate includes
a first sensing pattern electrically connected to the first conductive structure, and
a second sensing pattern vertically isolated from direct contact with a top surface of the first sensing pattern, the second sensing pattern electrically connected to the second conductive structure such that the first and second sensing patterns are electrically coupled to the interconnection substrate via different conductive structures of the first and second conductive structures.

11. The sensor package of claim 10, wherein each fingerprint sensor of the plurality of fingerprint sensors further includes
a passive device on the interconnection substrate of the fingerprint sensor, the passive device laterally isolated from direct contact with both the semiconductor chip of the fingerprint sensor and the conductive structures of the fingerprint sensor; and
a mold layer between the interconnection substrate of the fingerprint sensor and the interposer substrate of the fingerprint sensor to cover a side surface of the conductive structures of the fingerprint sensor, the semiconductor chip of the fingerprint sensor, and the passive device of the fingerprint sensor.

12. The sensor package of claim 10, wherein
the interposer substrate further comprises a ground pattern on a bottom surface of the first sensing pattern, and
the ground pattern is vertically isolated from direct contact with the bottom surface of the first sensing pattern.

13. The sensor package of claim 12, wherein the film substrate includes one or more inner surfaces at least partially defining one or more holes that penetrate the second region of the film substrate.

14. The sensor package of claim 13, wherein
the film substrate further comprises alignment keys, the alignment keys isolated from direct contact with the holes, and
the alignment keys are on the second region of the film substrate.

15. A fingerprint sensor package, comprising:
a film substrate including a coupling terminal;
an interconnection substrate on the film substrate;
a connection solder between the film substrate and the interconnection substrate, the connection solder electrically connected to the coupling terminal;
a lower under-fill layer between the film substrate and the interconnection substrate, the lower under-fill layer covering a side surface of the connection solder;
a semiconductor chip on a top surface of the interconnection substrate;
bumps between the top surface of the interconnection substrate and the semiconductor chip;
a passive device on the top surface of the interconnection substrate, the passive device laterally isolated from direct contact with the semiconductor chip;
conductive structures on the top surface of the interconnection substrate, the conductive structures laterally isolated from direct contact with both the semiconductor chip and the passive device;
an interposer substrate on both the semiconductor chip and the conductive structures, the interposer substrate electrically connected to the conductive structures; and
a mold layer between the interconnection substrate and the interposer substrate, the mold layer covering side surfaces of the conductive structures, the semiconductor chip, and the passive device,
wherein the interposer substrate includes
first sensing patterns,
second sensing patterns on top surfaces of the first sensing patterns, the second sensing patterns vertically isolated from direct contact with the top surfaces of the first sensing patterns; and
a protection layer covering the second sensing patterns.

16. The fingerprint sensor package of claim 15, wherein the conductive structures comprise:
first conductive structures electrically connected to the first sensing patterns; and
second conductive structures electrically connected to the second sensing patterns and isolated from direct contact with the first conductive structures.

17. The fingerprint sensor package of claim 15, wherein
the first sensing patterns extend in parallel in a first direction and are isolated from direct contact with each other in a second direction, when viewed in a plan view,
the second sensing patterns extend in parallel in the second direction and are isolated from direct contact with each other in the first direction, when viewed in the plan view, and
the second direction crosses the first direction.

18. The fingerprint sensor package of claim 15, wherein the interposer substrate further comprises:
a ground pattern, the ground pattern on bottom surfaces of the first sensing patterns and is vertically isolated from direct contact with the bottom surfaces of the first sensing patterns; and
a ground guide pattern, which is laterally isolated from direct contact with the second sensing patterns and is exposed by the protection layer,
wherein the ground guide pattern is on an edge region of the interposer substrate, when viewed in a plan view.

19. The fingerprint sensor package of claim 18, wherein the ground guide pattern is electrically connected to the ground pattern and is electrically isolated from the first sensing patterns and the second sensing patterns.

20. The fingerprint sensor package of claim 15, wherein each of the conductive structures comprises:
a core portion including a first metal;
a solder portion enclosing the core portion; and
a conductive adhesive portion between the core portion and the solder portion, the conductive adhesive portion including a second metal,
wherein the second metal comprises a material different from both the first metal and the solder portion.

* * * * *